(12) United States Patent
Nozoe

(10) Patent No.: US 11,794,800 B2
(45) Date of Patent: Oct. 24, 2023

(54) STEERING-WHEEL GRIP SENSOR AND GRIP DETECTION METHOD

(71) Applicant: Panasonic Intellectual Property Management Co., Ltd., Osaka (JP)

(72) Inventor: Toshiyuki Nozoe, Kyoto (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 246 days.

(21) Appl. No.: 17/327,181

(22) Filed: May 21, 2021

(65) Prior Publication Data
US 2021/0371000 A1    Dec. 2, 2021

(30) Foreign Application Priority Data

May 28, 2020  (JP) .................................. 2020-093496
Jan. 20, 2021  (JP) .................................. 2021-006976

(51) Int. Cl.
| | | |
|---|---|---|
| B62D 1/04 | (2006.01) | |
| G01V 3/08 | (2006.01) | |
| H03F 3/70 | (2006.01) | |
| H03M 1/12 | (2006.01) | |
| B60R 16/027 | (2006.01) | |

(52) U.S. Cl.
CPC ............ *B62D 1/046* (2013.01); *G01V 3/088* (2013.01); *H03F 3/70* (2013.01); *H03M 1/12* (2013.01); *B60R 16/027* (2013.01)

(58) Field of Classification Search
CPC .......... B62D 1/046; B62D 1/06; G01V 3/088; G01V 3/06; H03F 3/70; H03F 2203/45526; H03F 3/45475; H03M 1/12; H03M 1/1255; B60R 16/027
USPC ......................................................... 324/663
See application file for complete search history.

(56) References Cited

U.S. PATENT DOCUMENTS

| | | | | |
|---|---|---|---|---|
| 3,731,672 | A * | 5/1973 | McIntosh | A61B 5/316 600/372 |
| 3,938,394 | A * | 2/1976 | Morrow | H03B 28/00 702/56 |
| 4,418,352 | A * | 11/1983 | Horike | B41J 2/185 347/90 |
| 7,656,169 | B2 | 2/2010 | Scheckenbach et al. | |
| 2009/0167436 | A1 * | 7/2009 | Ardehali | H03F 3/2171 330/251 |

(Continued)

*Primary Examiner* — Christopher P McAndrew
(74) *Attorney, Agent, or Firm* — Greenblum & Bernstein, P.L.C.

(57) ABSTRACT

A steering-wheel grip sensor includes: a driven electrode having a planar shape and extending along a rim of a steering wheel; a sensor electrode having a planar shape and opposed to the driven electrode; a sine-wave generator that supplies a sinusoidal voltage to the driven electrode; a charge amplifier that includes a feedback capacitive element, detects a change in an amount of charge generated according to capacitance of the sensor electrode, and outputs the change in the amount of charge as a change in a voltage; a multiplication processor that multiplies the sinusoidal voltage by an output voltage from the charge amplifier; an integrator that smooths, by integration, a result of multiplication by the multiplication processor; and a grip determiner that determines whether the steering wheel is gripped, according to a level of the result smoothed.

20 Claims, 12 Drawing Sheets

(56) References Cited

U.S. PATENT DOCUMENTS

| | | | |
|---|---|---|---|
| 2010/0013688 A1* | 1/2010 | Murakami | H03M 3/368 |
| | | | 341/143 |
| 2010/0117727 A1* | 5/2010 | Dawson | H03F 3/602 |
| | | | 330/124 R |
| 2015/0171768 A1* | 6/2015 | Perreault | H02M 7/537 |
| | | | 330/251 |
| 2017/0231499 A1* | 8/2017 | Gimzewski | A61B 5/067 |
| | | | 600/566 |
| 2017/0240095 A1* | 8/2017 | Ikeda | H03K 17/962 |
| 2018/0059819 A1* | 3/2018 | Moseley | G06F 3/04166 |

\* cited by examiner

FIG. 7

| | Cable breakage | Electrode breakage | Short circuit to ground | Short circuit between sensor electrode and driven electrode |
|---|---|---|---|---|
| Signal change | Amplitude change small (*1) | Amplitude decrease (*1) | Charge amplifier offset (*2) | Charge amplifier offset (*2) |
| Ordinary monitor mode | Impossible to detect | Impossible to detect | Possible to detect | Possible to detect |
| Temporary monitor mode | Possible to detect | Possible to detect | Possible to detect | Possible to detect |

— # STEERING-WHEEL GRIP SENSOR AND GRIP DETECTION METHOD

CROSS REFERENCE TO RELATED APPLICATIONS

The present application is based on and claims priority of Japanese Patent Application No. 2020-093496 filed on May 28, 2020 and Japanese Patent Application No. 2021-006976 filed on Jan. 20, 2021.

FIELD

The present disclosure relates to a steering-wheel grip sensor and a grip detection method for detecting the touch of a human hand on a steering wheel.

BACKGROUND

Patent Literature (PTL) 1 discloses a capacitive occupant detection system that detects proximity capacitance of a human body.

CITATION LIST

Patent Literature

PTL 1: U.S. Pat. No. 7,656,169

SUMMARY

However, technology disclosed in PTL 1 is susceptible of a further improvement.

In view of this, the present disclosure provides a steering-wheel grip sensor and a grip detection method that achieve further improvement over the technology.

A steering-wheel grip sensor according to an aspect of the present disclosure includes: a driven electrode that covers a rim of a steering wheel; a sensor electrode that covers the driven electrode; a sine-wave generator that supplies a sinusoidal voltage to the driven electrode; a charge amplifier that includes a feedback capacitive element, and detects charge generated in the sensor electrode; a multiplication processor that multiplies the sinusoidal voltage by an output voltage from the charge amplifier; an integrator that smooths, by integration, a result of multiplication by the multiplication processor; and a grip determiner that determines whether the steering wheel is gripped, according to a level of the result smoothed.

A grip detection method according to an aspect of the present disclosure is a grip detection method for use in a steering-wheel grip sensor that includes a driven electrode having a planar shape and extending along a rim of a steering wheel, and a sensor electrode having a planar shape and opposed to the driven electrode, the grip detection method including: supplying a sinusoidal voltage to the driven electrode; detecting, by a charge amplifier that includes a feedback capacitive element, a change in an amount of charge generated according to capacitance of the sensor electrode; generating, by the charge amplifier, an output voltage that changes according to the change in the amount of charge detected; multiplying the sinusoidal voltage by the output voltage generated by the charge amplifier; smoothing, by integration, a result of multiplying the sinusoidal voltage by the output voltage; and determining whether the steering wheel is gripped, according to a level of the result smoothed.

A steering-wheel grip sensor and a grip detection method according to the present disclosure achieve further improvement over the technology.

BRIEF DESCRIPTION OF DRAWINGS

These and other advantages and features of the present disclosure will become apparent from the following description thereof taken in conjunction with the accompanying drawings that illustrate a specific embodiment of the present disclosure.

FIG. 7 is an explanatory diagram of failure determination in Embodiment 2.

Figure 1:
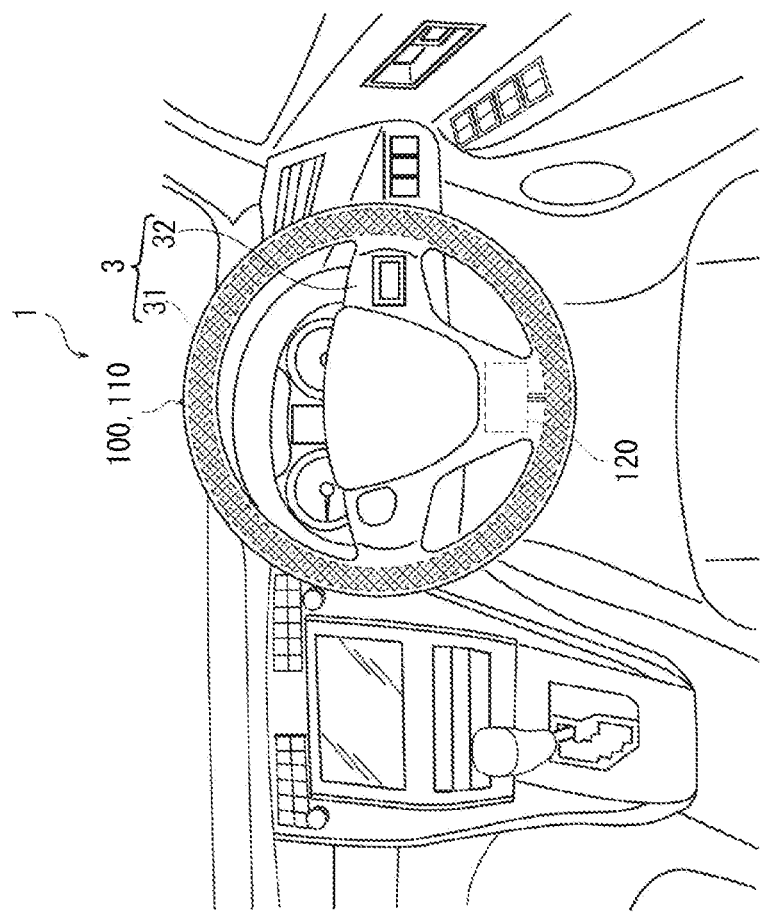
FIG. 1 illustrates an example of an interior layout of a vehicle in which a steering-wheel grip sensor according to Embodiment 1 is disposed.

DESCRIPTION OF EMBODIMENTS (Underlying Knowledge Forming Basis of the Present Disclosure)

The present inventors have found the capacitive occupant detection system according to PTL 1 stated in the "Background" section has problems as follows.

First, in PTL 1, switching operation is necessary in synchronous detection of a sense signal, and thus if the slew rate of edge components of a control signal for controlling switching deteriorates, distortion and detection phase shift occur in a signal that has been subjected to synchronous detection, which results in a problem that detection accuracy deteriorates.

Second, since sensitivity of a sense signal depends on the frequency of a sinusoidal signal, there is a problem that detection accuracy deteriorates if frequency variation occurs in a driving signal.

Third, the capacitive occupant detection system has frequency characteristics that the level of a sense signal increases with an increase in the frequency of a driving signal, and thus there is a problem that detection accuracy deteriorates as the frequency of exogenous radio-frequency noise is higher.

In view of this, the present disclosure provides a steering-wheel grip sensor and a grip detection method for reducing deterioration in the accuracy caused by frequency variation and influence of noise, for instance, and improving detection accuracy.

In order to solve such problems, a steering-wheel grip sensor according to an aspect of the present disclosure includes: a driven electrode having a planar shape and extending along a rim of a steering wheel; a sensor electrode having a planar shape and opposed to the driven electrode; a sine-wave generator that supplies a sinusoidal voltage to the driven electrode; a charge amplifier that includes a feedback capacitive element, detects a change in an amount of charge generated according to capacitance of the sensor electrode, and outputs the change in the amount of charge as a change in a voltage; a multiplication processor that multiplies the sinusoidal voltage by an output voltage from the charge amplifier; an integrator that smooths, by integration, a result of multiplication by the multiplication processor; and a grip determiner that determines whether the steering wheel is gripped, according to a level of the result smoothed.

According to this, deterioration in the accuracy due to frequency variation and influence of noise, for instance, can be reduced, and the detection accuracy can be improved. Specifically, first, the output voltage from the charge amplifier and the sinusoidal voltage as a driving signal are in phase, that is, have no phase difference, and the multiplication processor detects the capacitance according to whether the steering wheel is gripped by product detection. Accordingly, the switching operation as required in conventional technology is unnecessary, phase shift and signal distortion due to switching can be prevented, deterioration in detection accuracy can be reduced, and detection accuracy can be improved. Second, sensitivity of an output voltage from the charge amplifier does not depend on the frequency of a sinusoidal voltage as a driving signal, and thus even if a frequency variation occurs in a sinusoidal signal, deterioration in detection accuracy can be prevented. Third, the magnitude of an output voltage from the charge amplifier does not depend on the frequency of a sinusoidal voltage as a driving signal, and thus deterioration in detection accuracy due to exogenous radio-frequency noise can be reduced.

Here, the charge amplifier may include: a first input terminal that receives the sinusoidal voltage; a second input terminal connected to the sensor electrode; an output terminal; the feedback capacitive element connected between the output terminal and the second input terminal; and an operational amplifier connected to the first input terminal, the second input terminal, and the output terminal, and the charge amplifier may supply the sinusoidal voltage output through the output terminal to the sensor electrode via the feedback capacitive element.

According to this, the charge amplifier includes the feedback capacitive element, and thus outputs a change in the amount of charge generated in the sensor electrode as a change in a voltage. The charge amplifier can be configured of a general purpose operational amplifier having two input terminals and one output terminal, which reduces the circuit cost.

Here, the sine-wave generator may receive a rectangular-wave signal, and generate the sinusoidal voltage in synchronization with the rectangular-wave signal.

According to this, it is unnecessary to include a quartz oscillator so that the circuit cost can be reduced.

Here, the charge amplifier may include a low-pass filter connected in parallel to the feedback capacitive element, and the low-pass filter may pass a signal having a frequency lower than a frequency of the sinusoidal voltage.

According to this, the output voltage through the output terminal, which indicates capacitance according to whether the steering wheel is gripped, is in phase with the sinusoidal voltage, and at the same time, a signal that indicates a resistance component such as leakage through the output terminal has a 90-degree phase shift from the sinusoidal voltage. The multiplication by the multiplication processor cancels out the latter signal, and thus disturbance-resistant and noise-resistant characteristics improve.

Here, the steering-wheel grip sensor may further include: a memory; a first analog-to-digital (AD) converter that performs AD conversion (analog-to-digital conversion) on the output voltage from the charge amplifier in synchronization with the rectangular-wave signal, and stores a result of the AD conversion into the memory as first digital data; and a second AD converter that performs AD conversion on the sinusoidal voltage from the sine-wave generator in synchronization with the rectangular-wave signal, and stores a result of the AD conversion into the memory as second digital data. The multiplication processor may perform processing for averaging each of a waveform indicated by the first digital data and a waveform indicated by the second digital data, and multiply the first digital data averaged by the second digital data averaged.

According to this, AD conversion and multiplication can be conducted highly accurately.

Here, the steering-wheel grip sensor may further include: a memory; a first analog-to-digital (AD) converter that performs AD conversion on the output voltage from the charge amplifier in synchronization with the rectangular-wave signal, and stores a result of the AD conversion into the memory as first digital data; and a second AD converter that performs AD conversion on the sinusoidal voltage from the sine-wave generator in synchronization with the rectangular-wave signal, and stores a result of the AD conversion into the memory as second digital data. The multiplication processor may multiply the first digital data by the second digital data, and perform processing for averaging a waveform indicated by digital data resulting from multiplying the first digital data by the second digital data.

According to this, as compared with the case where averaging processing is conducted prior to multiplication, the amount of data stored into the memory is less and the amount of computing processing can be decreased.

Here, the rectangular-wave signal may be switched to one of at least three frequencies, and the first AD converter and the second AD converter may store, for each of the at least three frequencies, the first digital data and the second digital data into the memory, respectively.

This avoids using first and second digital data corresponding to the frequency, which is influenced by disturbance noise, and allows first and second digital data corresponding to another frequency to be used. Furthermore, frequency hopping can be performed so as to avoid disturbance noise.

Here, the first AD converter and the second AD converter may generate the first digital data and the second digital data, respectively, the first digital data and the second digital data each corresponding to at least two cycles of a waveform of the sinusoidal voltage.

According to this, detection accuracy can be improved as compared with AD conversion performed in units of one cycle.

Here, the first AD converter and the second AD converter may generate the first digital data and the second digital data, respectively, the first digital data and the second digital data each corresponding to at least three cycles of a waveform of the sinusoidal voltage, and the multiplication processor may compare portions of the first digital data corresponding to different ones of the at least three cycles of the waveform, and discard one of the portions of the first digital data having a most distant value.

According to this, for example, a portion of digital data corresponding to a cycle, which is affected by disturbance noise, can be discarded, and thus detection accuracy can be improved.

Here, the first AD converter and the second AD converter may generate the first digital data and the second digital data, respectively, the first digital data and the second digital data each corresponding to at least three cycles of a waveform of the sinusoidal voltage, and the multiplication processor may calculate, for each of the at least three cycles of the waveform, an average and a deviation of a portion of the first digital data corresponding to the cycle, and discard the portion of the first digital data corresponding to the cycle when the deviation is greater than or equal to a threshold.

According to this, a portion of data corresponding to a cycle, which includes disturbance noise, can be discarded, and thus noise resistance and accuracy can be increased.

Here, the multiplication processor may change a frequency of the rectangular-wave signal when a predetermined number of cycles for which the deviation is greater than or equal to the threshold are in a continuous series.

According to this, when disturbance noise continuously occurs, the influence of disturbance noise can be reduced by changing the frequencies of a rectangular-wave signal and a sinusoidal voltage.

Here, the steering-wheel grip sensor may further include: a monitor that monitors whether a failure has occurred; and an attenuation switch that attenuates or amplifies the sinusoidal voltage. The monitor may have an ordinary monitor mode in which the attenuation switch does not attenuate or amplify the sinusoidal voltage and a temporary monitor mode in which the attenuation switch attenuates or amplifies the sinusoidal voltage. In the ordinary monitor mode, the monitor may monitor whether at least one of a ground fault of the driven electrode or a ground fault of the sensor electrode has occurred, and in the temporary monitor mode, the monitor may monitor whether at least one of a breakage of the driven electrode, a breakage of the sensor electrode, or a short circuit between the driven electrode and the sensor electrode has occurred.

Here, the monitor may control an attenuation factor and an amplification factor of the attenuation switch.

According to this, performance of the steering-wheel grip sensor can be assessed by controlling an attenuation factor and an amplification factor. Furthermore, an attenuation factor and an amplification factor can be appropriately determined according to variations of individual steering-wheel grip sensors.

Here, the steering-wheel grip sensor may further include: a corrector that performs correction processing for reducing a variation in an amount of charge generated in the sensor electrode, the variation being caused by an environmental change. The multiplication processor may further: shift a phase of the output voltage from the charge amplifier by 90 degrees; multiply the sinusoidal voltage by the output voltage shifted; and output, as an index of the environmental change, a result of multiplying the sinusoidal voltage by the output voltage shifted to the corrector.

According to this, for example, if the resistance of an insulator that covers the sensor electrode has characteristics of varying according to the moisture/humidity, detection accuracy can be improved by correction processing for reducing such variation.

Here, the steering-wheel grip sensor may further include: an other charge amplifier that includes a feedback capacitive element, detects a change in an amount of charge generated in the driven electrode, and outputs the change in the amount of charge as a change in a voltage, the change in the amount of charge being caused by an environmental change; and a corrector that performs correction processing for reducing a variation in the amount of charge generated in the driven electrode, the variation being caused by the environmental change. The multiplication processor may further: multiply the sinusoidal voltage by an output voltage from the other charge amplifier; and output, as an index of the environmental change, a result of multiplying the sinusoidal voltage by the output voltage to the corrector.

According to this, for example, if the capacitance of an insulator in contact with the driven electrode has characteristics of varying according to the moisture/humidity or temperature, detection accuracy can be improved by correction processing for reducing such variation.

Here, the steering-wheel grip sensor may further include: a current amplifier that includes a feedback resistive element, and outputs a change in a current generated in the driven electrode as a change in a voltage; and a corrector that performs correction processing for reducing a variation in the current generated in the driven electrode, the variation being caused by an environmental change. The multiplication processor may further multiply the sinusoidal voltage by an output voltage from the current amplifier, and output, as an index of the environmental change, a result of multiplying the sinusoidal voltage by the output voltage to the corrector.

According to this, for example, if the resistance of an insulator in contact with the driven electrode has characteristics of varying according to the moisture/humidity or temperature, detection accuracy can be improved by correction processing for reducing such variation.

Here, the low-pass filter may include: a first resistive element; a second resistive element connected in series to the first resistive element; a first capacitive element connected to a connecting point of the first resistive element and the second resistive element; and a third resistive element connected in series to the first capacitive element.

According to this, saturation can be prevented by limiting the gain of the charge amplifier. Furthermore, a third resistor is included so that the peak of the gain at a specific frequency (a cutoff frequency) can be lowered.

Here, the steering-wheel grip sensor may further include: a charge supply circuit that supplies a predetermined amount of charge to the charge amplifier in an operation mode for failure monitoring. The monitor may monitor whether operation of the charge amplifier is normal, based on an output from the charge amplifier when charge is not supplied from the charge supply circuit, and an output from the charge amplifier when charge is supplied from the charge supply circuit.

According to this, the monitor can monitor whether the operation of the charge amplifier is normal. Furthermore, the monitor can monitor whether the operation of the differential amplifier is normal.

Here, the steering-wheel grip sensor may further include: a variable resistor provided between a ground and a connecting point of the sensor electrode and the charge amplifier.

According to this, the variable resistor allows correction to reduce variation in the operation which is caused by an environmental change such as a change in the temperature or moisture/humidity of the steering-wheel grip sensor, for instance.

A grip detection method according to an aspect of the present disclosure is a grip detection method for use in a steering-wheel grip sensor that includes a driven electrode having a planar shape and extending along a rim of a steering wheel, and a sensor electrode having a planar shape and opposed to the driven electrode, the grip detection method including: supplying a sinusoidal voltage to the driven electrode; detecting, by a charge amplifier that includes a feedback capacitive element, a change in an amount of charge generated according to capacitance of the sensor electrode; generating, by the charge amplifier, an output voltage that changes according to the change in the amount of charge detected; multiplying the sinusoidal voltage by the output voltage generated by the charge amplifier; smoothing, by integration, a result of multiplying the sinusoidal voltage by the output voltage; and determining whether the steering wheel is gripped, according to a level of the result smoothed.

According to this, deterioration in the accuracy due to frequency variation and influence of noise, for instance, can be reduced, and the detection accuracy can be improved.

Note that these general and specific aspects may be implemented using a system, a method, an integrated circuit, a computer program, a computer-readable recording medium such as a CD-ROM, or any combination of systems, methods, integrated circuits, computer programs, and recording media.

The following specifically describes embodiments, with reference to the drawings.

Note that the embodiments described below each indicate a general or specific example. The numerical values, shapes, materials, elements, the arrangement and connection of the elements, steps, and the processing order of the steps, for instance, described in the following embodiments are mere examples, and thus are not intended to limit the present disclosure.

Embodiment 1

[Appearance of Steering-Wheel Grip Sensor 100]

FIG. 1 illustrates an example of an interior layout of vehicle 1 in which steering-wheel grip sensor 100 according to an embodiment is disposed.

As illustrated in FIG. 1, vehicle 1 includes steering wheel 3, a speaker, and a display device such as a liquid crystal display. The speaker and the display device are configured as a warning device, for example.

Steering wheel 3 gives vehicle 1 a steering angle. Steering wheel 3 includes rim 31, spoke 32 having a substantially T shape and integrally formed with the inner circumference of rim 31, and a horn switch cover that covers a horn switch disposed in a center portion of spoke 32. Steering-wheel grip sensor 100 includes steering wheel cover 110 and control device 120.

Figure 2:
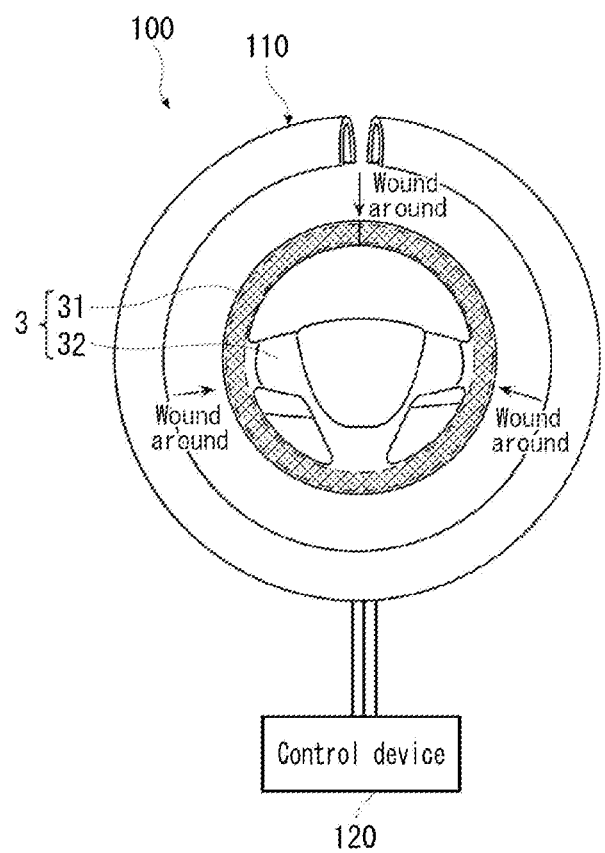
FIG. 2 illustrates an example of attaching a steering wheel cover of the steering-wheel grip sensor according to Embodiment 1 to a rim.

FIG. 2 illustrates an example of attaching steering wheel cover 110 of steering-wheel grip sensor 100 according to Embodiment 1 to rim 31.

As illustrated in FIG. 2, steering-wheel grip sensor 100 is a device that detects grip and touch of a hand of a user (a human hand) on steering wheel cover 110, and is disposed along rim 31 of vehicle 1. "Touch" means not only a state in which a hand of the user is directly touching steering wheel cover 110, but also a state in which the human hand is separate from steering wheel cover 110 as long as steering-wheel grip sensor 100 can detect the human hand.

Steering-wheel grip sensor 100 is a capacitive sensor that detects grip of a user in vehicle 1 that includes steering wheel 3. Specifically, steering-wheel grip sensor 100 detects whether the hand(s) of a user is/are touching steering wheel 3 by detecting a change in capacitance between the hand(s) of the user and steering-wheel grip sensor 100.

[Cross-Sectional Configuration of Steering Wheel Cover 110]

Figure 3:
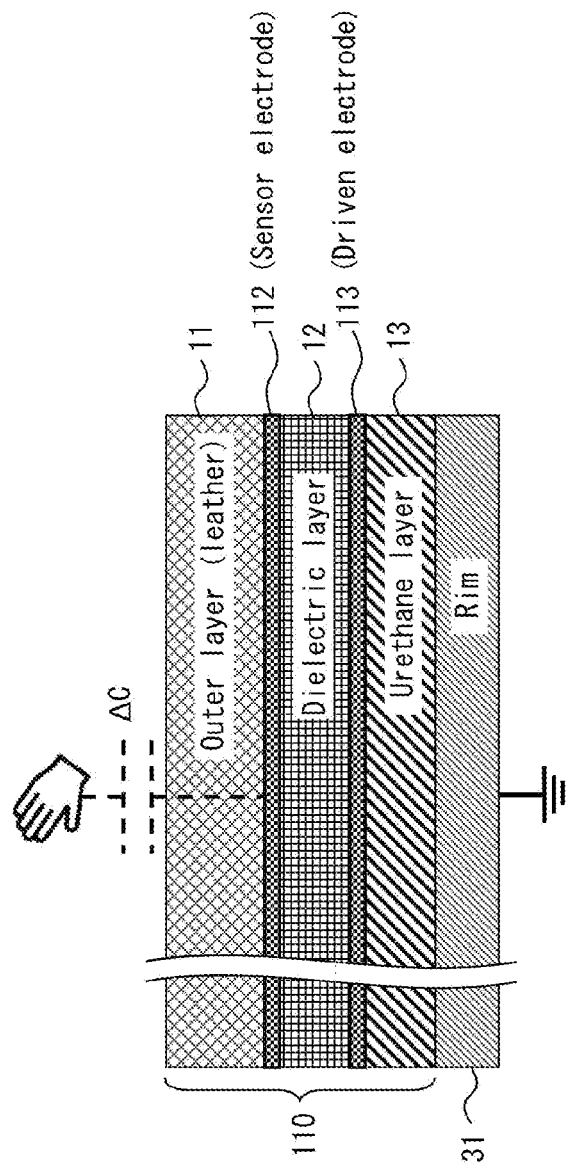
FIG. 3 illustrates an example of a cross-sectional configuration of the steering wheel cover in Embodiment 1.

FIG. 3 illustrates an example of a cross-sectional configuration of steering wheel cover 110 in Embodiment 1. The drawing is a schematic enlarged view of a portion of a cross section taken in a stack direction of steering wheel cover 110 wound around rim 31. As illustrated in FIG. 3, steering wheel cover 110 includes outer layer 11, sensor electrode 112, dielectric layer 12, driven electrode 113, and urethane layer 13. Rim 31 is grounded to the metal body of vehicle 1.

Outer layer 11 is made of an insulating material such as, for example, leather, synthetic leather, or synthetic resin.

Note that the configuration of steering wheel cover 110 is not limited to a configuration in which outer layer 11, sensor electrode 112, dielectric layer 12, driven electrode 113, and urethane layer 13 are integrally wound around rim 31, but may be a configuration in which a detector that integrally includes sensor electrode 112, dielectric layer 12, and driven electrode 113 is wound onto a surface of urethane layer 13 formed on rim 31, and further more outer layer 11 is wound onto the surface of the detector.

Sensor electrode 112 is a planar electrode formed of a mesh cloth woven from conductive fibers, for example. The shape of sensor electrode 112 may be shaped into a curved sheet that is a portion of an annular ring, may be shaped into a curved sheet that is a portion of a side surface of a cylinder, or may be an aggregate of small flat surfaces. Sensor electrode 112 in FIG. 3 is a curved planar electrode corresponding the entirety or a portion of an annular ring.

Driven electrode 113 may have the same configuration as that of sensor electrode 112 or may have a different configuration such as, for example, a configuration in which a metal line is sewn and fixed onto one surface of dielectric layer 12.

Sensor electrode 112 and driven electrode 113 are opposed to each other with dielectric layer 12 being provided therebetween to form a capacitive element. Capacitance ΔC is added to sensor electrode 112 in response to the touch made by the user hand, as shown by the broken line in FIG. 3. Steering-wheel grip sensor 100 determines whether a hand touches by detecting a change in capacitance ΔC.

[Circuit Configuration of Steering-Wheel Grip Sensor 100]

Figure 4:
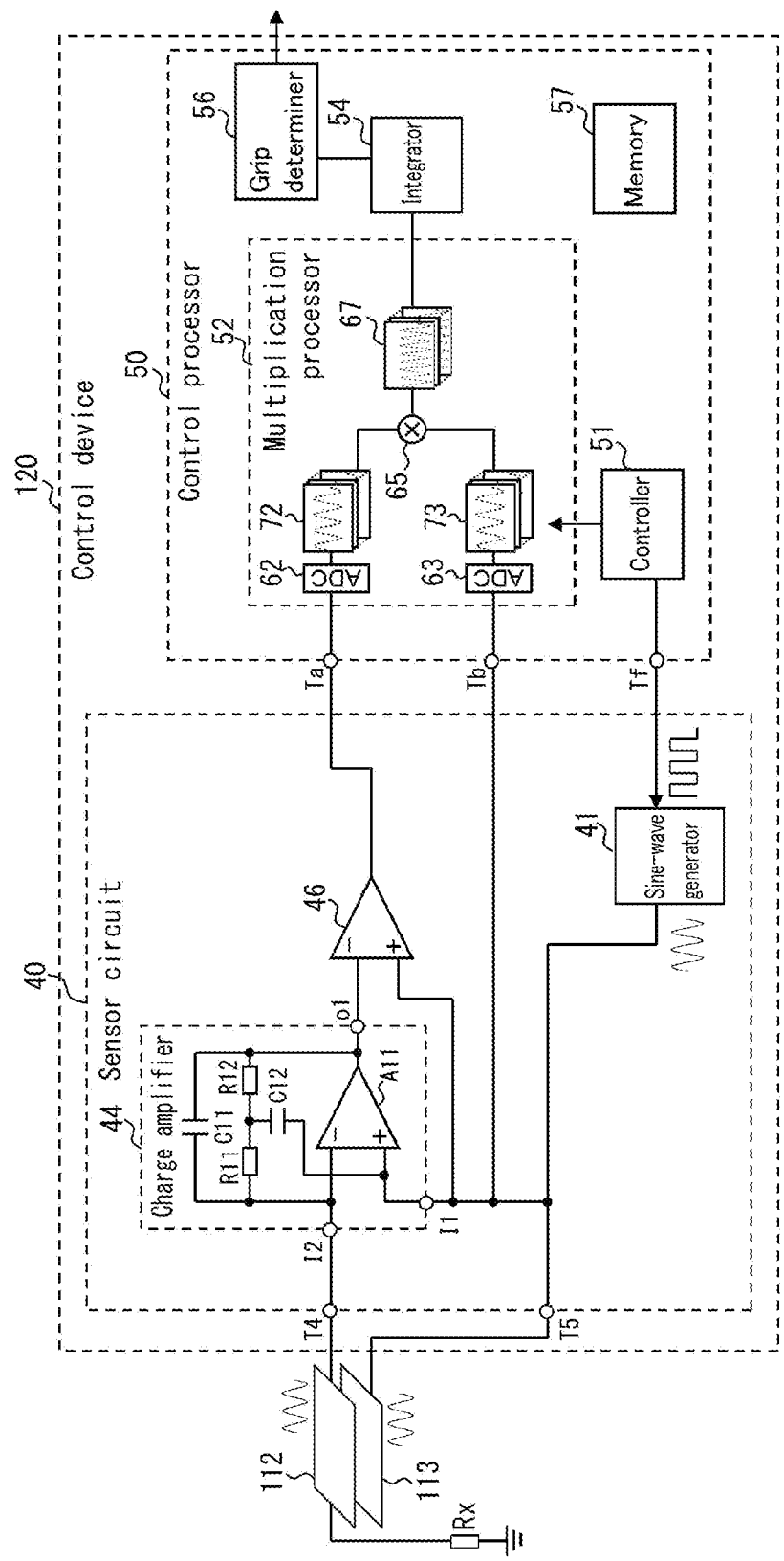
FIG. 4 is a block diagram illustrating an example of a circuit configuration of the steering-wheel grip sensor according to Embodiment 1.

FIG. 4 is a block diagram illustrating an example of a circuit configuration of steering-wheel grip sensor 100 according to Embodiment 1.

[Configuration of Steering-Wheel Grip Sensor 100]

FIG. 4 is a block diagram illustrating an example of a circuit configuration of control device 120 in steering-wheel grip sensor 100 according to Embodiment 1. Note that sensor electrode 112 and driven electrode 113 in steering wheel cover 110 are schematically added in the drawing.

Control device 120 in FIG. 4 includes sensor circuit 40 and control processor 50.

Sensor circuit 40 includes sensor terminal T4, drive terminal T5, sine-wave generator 41, charge amplifier 44, and differential amplifier 46.

Sensor terminal T4 is connected to sensor electrode 112 and second input terminal I2 of charge amplifier 44, and signals are simultaneously received by and output through sensor terminal T4. Specifically, a sinusoidal voltage fed back from charge amplifier 44 is transmitted through sensor terminal T4 to sensor electrode 112. Simultaneously with this, a change in the amount of charge in response to the change in capacitance of sensor electrode 112 is transmitted through sensor terminal T4 to charge amplifier 44.

Drive terminal T5 is connected to driven electrode 113 and sine-wave generator 41. A sinusoidal voltage as a driving signal is transmitted through drive terminal T5 from sine-wave generator 41 to driven electrode 113.

Sine-wave generator 41 receives a rectangular-wave signal from controller 51, generates a sinusoidal voltage synchronized with the rectangular-wave signal, and supplies the sinusoidal voltage as a driving signal to driven electrode 113 through drive terminal T5. The rectangular-wave signal input from controller 51 is, for example, a pulse width modulation (PWM) signal. Note that in the present embodiment, a sinusoidal voltage supplied from sine-wave generator 41 to driven electrode 113 may be a direct voltage (for example, 2V) on which a sine wave is superimposed.

Charge amplifier 44 includes feedback capacitive element C11, detects a change in the amount of charge according to capacitance of sensor electrode 112, and outputs the change in the amount of charge as a change in a voltage. Accordingly, charge amplifier 44 includes first input terminal I1, second input terminal I2, output terminal o1, feedback capacitive element C11, operational amplifier A11, resistive elements R11 and R12, and capacitive element C12. First input terminal I1 receives a sinusoidal voltage from sine-wave generator 41, and is connected to the non-inverting input terminal of operational amplifier A11.

Second input terminal I2 is connected to sensor terminal T4, and conveys a change in the amount of charge caused by a change in capacitance of sensor electrode 112 to the inverting input terminal of operational amplifier A11.

A voltage corresponding to a change in the amount of charge according to the capacitance of sensor electrode 112 is output through output terminal o1. For example, if the capacitance of sensor electrode 112 does not change, a sinusoidal voltage having the same phase and the same amplitude as those of a sinusoidal voltage applied through first input terminal I1 is output through output terminal o1. On the other hand, if the capacitance of sensor electrode 112 has changed, a sinusoidal voltage having the same phase as that of the sinusoidal voltage applied through first input terminal I1 and an amplitude corresponding to the change in the capacitance is output through output terminal o1.

Feedback capacitive element C11 is connected between output terminal o1 and second input terminal I2, and feeds back an output voltage applied through output terminal o1 to second input terminal I2. Feedback capacitive element C11 has a function of detecting a change in the amount of charge caused by a change in capacitance of sensor electrode 112.

Operational amplifier A11 outputs to second input terminal I2 through feedback capacitive element C11 an output voltage that eliminates the difference between signals at the non-inverting input terminal and inverting input terminal.

Differential amplifier 46 amplifies the difference between a sinusoidal voltage from sine-wave generator 41 and an output voltage from charge amplifier 44, and outputs the result of amplification as a sense signal to analog-to-digital converter (ADC) 62 through analog-to-digital (AD) terminal Ta.

A circuit that includes resistive elements R11 and R12 and capacitive element C12 forms a low-pass filter having a cut-off frequency lower than the frequency of a sinusoidal voltage. The low-pass filter is connected in parallel to feedback capacitive element C11, and operates, at a frequency lower than the frequency of the sinusoidal voltage, more dominantly than capacitive element C11 to pass and feed back an output voltage applied through output terminal o1. Accordingly, the low-pass filter limits the gain of operational amplifier A11 to prevent gain saturation, and reduces a noise component. On the other hand, the output voltage is prevented from being fed back by the operation of capacitive element C12 and resistive elements R11 and R12, at a frequency higher than the cut-off frequency. As a result, capacitive element C11 dominantly operate to pass the output voltage applied through output terminal o1. Thus, the low-pass filter limits the gain to prevent saturation at a frequency lower than the frequency of a sine wave, and reduces a noise component. Operational amplifier A11 switches to charge amplification according to only capacitive element C11 at a frequency higher than the frequency of a sine wave.

More specifically, sensor electrode 112 is connected to the ground via resistor Rx, as illustrated in FIG. 4. Resistor Rx has parasitic resistance based on a resistance component of dielectric layer 12 located between sensor electrode 112 and the ground. As described above, when a sinusoidal voltage supplied to driven electrode 113 is a direct voltage on which a sine wave is superimposed, a direct current flows to the ground through resistor Rx. Here, if the resistivity of dielectric layer 12 changes due to temperature change or moisture/humidity change, the value of the direct current that flows to the ground through resistor Rx. In order to reduce the influence of such a change in a direct current component, the gain of operational amplifier A11 is limited to prevent saturation by providing a low-pass filter having a cut-off frequency lower than the frequency of the sinusoidal voltage.

Figure 9:
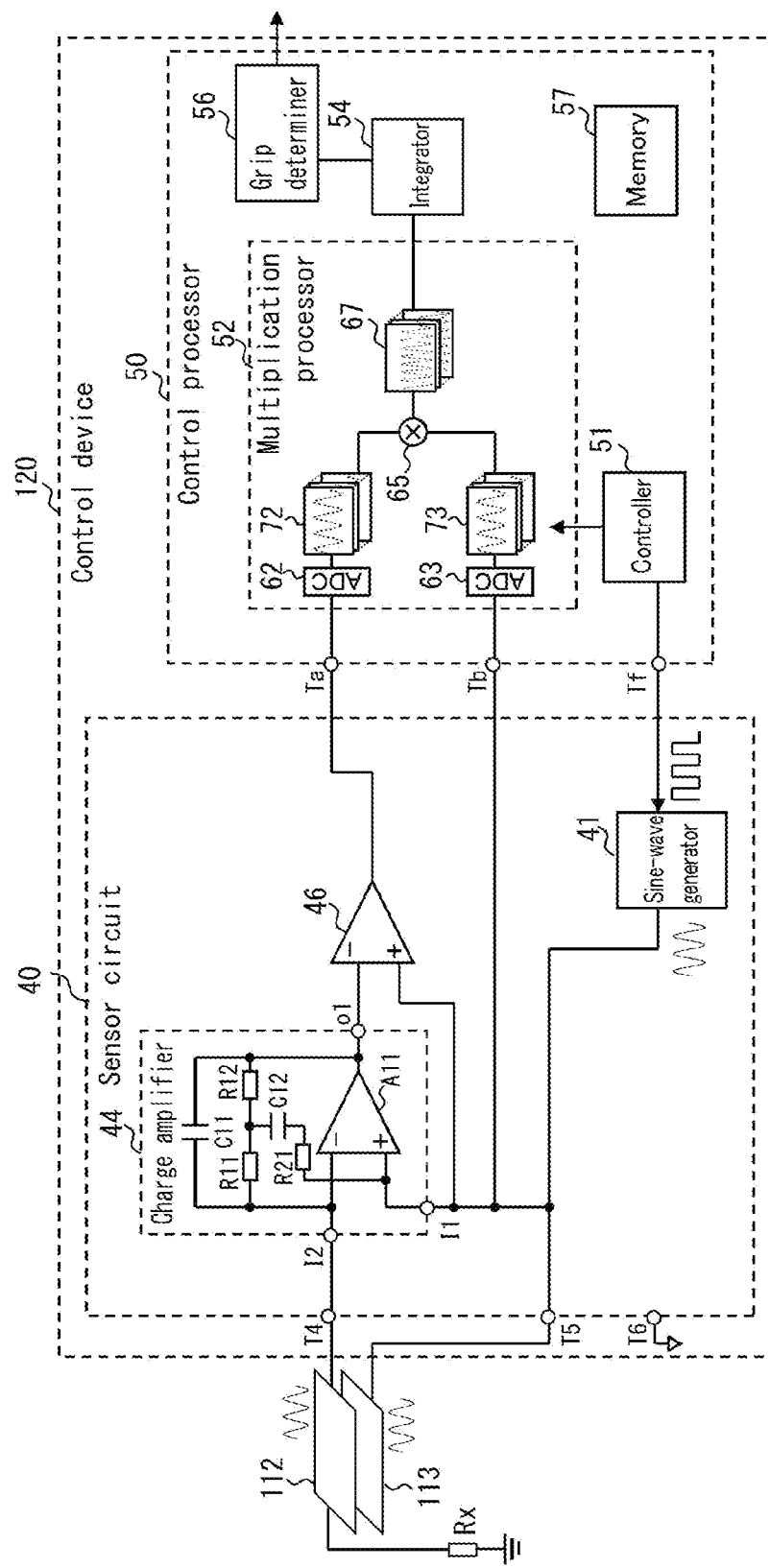
FIG. 9 is a block diagram illustrating another example of a circuit configuration of the steering-wheel grip sensor according to Embodiment 1.

Note that the low-pass filter includes resistive elements R11 and R12 connected in series and capacitive element C12 provided between the non-inverting input terminal of operational amplifier A11 and a connecting point of resistive elements R11 and R12 in FIG. 4, yet may further include resistor R21 in series to capacitive element C12 as illustrated in FIG. 9 in addition to the above elements. By providing resistor R21, the peak of the gain generated at a specific frequency (the cut-off frequency) can be lowered.

In FIG. 4, control processor 50 includes AD terminal Ta, AD terminal Tb, PWM terminal Tf, controller 51, multiplication processor 52, integrator 54, grip determiner 56, and memory 57. Multiplication processor 52 includes ADCs 62 and 63, and multiplier 65. Note that control processor 50 may be achieved by a microcomputer or a microcontroller that includes a central processing unit (CPU), memory 57, ADCs 62 and 63, multiplier 65, and an input/output port, for instance. Memory 57 is a generic term for read only memory (ROM), random access memory (RAM), and electrically erasable flash memory. The functional block in FIG. 4 can be achieved by the CPU executing a program in memory 57. Note that multiplier 65 may be a hardware circuit, or a portion or the entirety of multiplier 65 may be achieved by software.

First digital data 72, second digital data 73, and first multiplication data 67 are illustrated as data to be processed in multiplication processor 52. Such data items are temporarily stored in memory 57, for example.

AD terminal Ta is connected to an output terminal of differential amplifier 46, and is for inputting an analog signal to ADC 62.

AD terminal Tb is connected to a terminal through which a sinusoidal voltage from sine-wave generator 41 is output, and is for inputting an analog sinusoidal voltage to ADC 63.

PWM terminal Tf is connected to controller 51 and sine-wave generator 41, and is for conveying a rectangular-wave signal from controller 51 to sine-wave generator 41. The rectangular-wave signal may be a PWM signal.

Controller 51 generates a rectangular-wave signal having a variable frequency, and outputs the signal to sine-wave generator 41 through PWM terminal Tf. Controller 51 controls and causes ADCs 62 and 63 to obtain samples from an analog signal in synchronization with the rectangular-wave signal. The number of samples may be, for example, 16 samples per cycle of a sinusoidal voltage or a sense signal, or may be 8 to 24 samples per the cycle.

Multiplication processor 52 multiplies a sinusoidal voltage from sine-wave generator 41 by the output voltage from charge amplifier 44. The sinusoidal voltage from sine-wave generator 41 is input through AD terminal Tb. The output voltage from charge amplifier 44 is input as a sense signal via differential amplifier 46 through AD terminal Ta. The result of the multiplication corresponds to the magnitude of capacitance of sensor electrode 112 according to whether the steering wheel is gripped.

ADC 62 performs AD conversion on a sense signal from differential amplifier 46 as an output voltage from charge amplifier 44 in synchronization with a rectangular-wave signal from controller 51, and stores the result of the AD conversion as first digital data 72 into memory 57. First digital data 72 corresponds to the waveform of an N cycle or N cycles of the sense signal. Here, N may be 1 or may be 2 or 3 or more.

ADC 63 performs AD conversion on a sinusoidal voltage from sine-wave generator 41 in synchronization with a rectangular-wave signal from controller 51, and stores the result of the AD conversion as second digital data 73 into memory 57. Second digital data 73 corresponds to at least an N cycle or N cycles of the sinusoidal voltage. N is defined in the same manner as described with regard to first digital data 72.

Multiplier 65 multiplies first digital data 72 by second digital data 73, and stores the result of the multiplication into memory 57 as first multiplication data 67.

Note that multiplication processor 52 may perform processing for averaging each of the waveform indicated by first digital data 72 and the waveform indicated by second digital data 73, may multiply the averaged first digital data by the averaged second digital data, and use the result of the multiplication as first multiplication data 67. At this time, integrator 54 may perform the processing for averaging, instead of multiplication processor 52.

Alternatively, multiplication processor 52 may multiply first digital data 72 by second digital data 73, and perform processing for averaging the waveform indicated by first multiplication data 67 that is the result of the multiplication. At this time, integrator 54 may perform the averaging processing, instead of multiplication processor 52.

Integrator 54 performs averaging, that is, smoothing by integrating the result of multiplication by multiplication processor 52.

Grip determiner 56 determines whether the steering wheel is gripped, according to the level of the smoothed result of multiplication. The level of the smoothed result of multiplication corresponds to the capacitance of sensor electrode 112, and is higher when the steering wheel is gripped than when the steering wheel is not gripped, for example. Grip determiner 56 may give hysteresis in determining whether the steering wheel is gripped. Specifically, grip determiner 56 determines that a non-gripped state is changed to a gripped state when the level of the smoothed result of multiplication reaches first threshold th1 or above. On the other hand, grip determiner 56 determines that a gripped state is changed to a non-gripped state when the level of the smoothed result of multiplication reaches second threshold th2 or below. At this time, if first threshold th1>second threshold th2, hysteresis can be given.

[Comparative Description of Steering-Wheel Grip Sensor 100 and Comparative Example]

Next, steering-wheel grip sensor 100 and a comparative example are to be described in comparison with each other.

Figure 5:
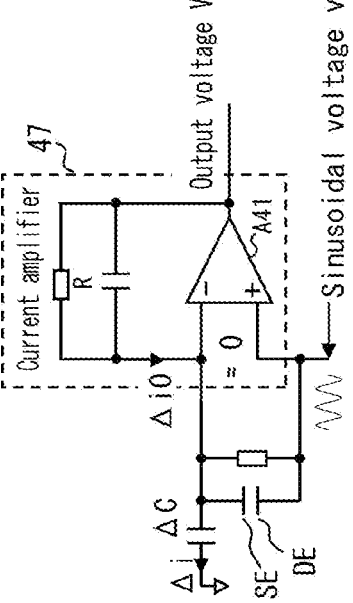
FIG. 5 is an explanatory diagram of operation of a sensor according to a comparative example and the steering-wheel grip sensor according to Embodiment 1 in comparison with each other.

FIG. 5 is an explanatory diagram of operation of a sensor according to the comparative example and steering-wheel grip sensor 100 according to Embodiment 1 in comparison with each other. The comparative example in FIG. 5 illustrates a similar configuration based on the sensor according to PTL 1.

In the circuit configuration of the comparative example, sensor electrode SE is connected to the inverting input terminal of operational amplifier A41. Driven electrode DE is connected to the non-inverting input terminal, and receives a sinusoidal voltage.

Current amplifier 47 includes feedback resistive element R, detects current $\Delta i$ that flows in response to change $\Delta C$ of capacitance of sensor electrode SE, and outputs a voltage corresponding to the detected current. Thus, the current amplifier is a current to voltage converter that outputs a detected current as a voltage.

The "Math expression" column of the comparative example shows output voltage $V=R\times\Delta i0$. $\Delta i0$ denotes a feedback current that flows through feedback resistive element R, and $\Delta i0$ is equal to $\Delta i$ from the viewpoint of a virtual short circuit between the non-inverting input terminal and the inverting input terminal. Current $\Delta i$ that flows in response to change $\Delta C$ of capacitance of sensor electrode SE can be represented by $\Delta i=\omega\times\Delta C\times v$. Here, v denotes a sinusoidal voltage supplied to the non-inverting input terminal and driven electrode DE. Output voltage V from current amplifier 47 can be represented by $V=\omega\times(\Delta C\times v)\times R$. Here, $\omega=2\pi f$. f denotes the frequency of sinusoidal voltage v. Output voltage V in the comparative example is proportional not only to capacitance $\Delta C$, but also to frequency f.

As shown by the "Signal waveform" column of the comparative example, output voltage V has a 90-degree phase shift from sinusoidal voltage v. The "Signal waveform" column of the comparative example shows examples of two types of waveforms obtained by synchronous switch detection for detecting a change in resistance component and phase switch detection for detecting capacitance components. Both detections involve switching operation.

As a result, the comparative example has a problem as follows. First, switching operation is necessary in detecting output voltage V, and thus if the slew rate of edge components of a control signal for controlling switching deteriorates, distortion and detection phase shift occur in a signal that has been subjected to synchronous detection, which results in a problem that detection accuracy deteriorates.

Second, sensitivity of output voltage V depends on frequency f, and thus there is a problem that detection accuracy deteriorates if frequency variation occurs in a driving signal.

Third, the comparative example has frequency characteristics that output voltage V increases with an increase in frequency f, and thus there is a problem that detection accuracy deteriorates as the frequency of exogenous radio-frequency noise is higher.

To address such problems, charge amplifier 44 in the "Embodiment" in the "Circuit configuration" column in FIG. 5 detects change $\Delta Q$ of the amount of charge generated according to capacitance $\Delta C$ of sensor electrode 112 and outputs change $\Delta Q$ of the amount of charge as a change in output voltage V, as already described with reference to FIG. 4. $\Delta Q0$ denotes feedback charge that generates capacitance of feedback capacitive element C, and $\Delta Q0$ is equal to $\Delta Q$ from the viewpoint of virtual shortcut between the non-inverting input terminal and the inverting input terminal. Output voltage V from charge amplifier 44 is represented by $V=(\Delta C/C) \times v$. C denotes the capacitance of the feedback capacitive element. Output voltage V is proportional to capacitance $\Delta C$ and does not depend on frequency f. As shown in the "Signal waveform" column, output voltage V and sinusoidal voltage v have no phase difference, and thus are in phase. Accordingly, product detection performed using the product of output voltage V and sinusoidal voltage v is possible, rather than performing synchronous detection using switching operation. The "Signal waveform" column shows first multiplication data 67 and second multiplication data 68 as examples of product detection. First multiplication data 67 indicates the result of multiplying output voltage V by sinusoidal voltage v, and represents capacitance $\Delta C$ of sensor electrode 112. Second multiplication data 68 indicates the result of multiplying sinusoidal voltage v by the waveform of output voltage V having a 90-degree shifted phase.

Steering-wheel grip sensor 100 according to Embodiment 1 solves the first problem stated above using product detection. Since output voltage V from charge amplifier 44 does not depend on the frequency of sinusoidal voltage v, and thus the second and third problems stated above are solved.

As described above, steering-wheel grip sensor 100 according to Embodiment 1 includes: driven electrode 113 having a planar shape and extending along a rim of a steering wheel; sensor electrode 112 having a planar shape and opposed to driven electrode 113; sine-wave generator 41 that supplies sinusoidal voltage v to driven electrode 113; charge amplifier 44 that includes feedback capacitive element C11, detects a change in an amount of charge generated according to capacitance of sensor electrode 112, and outputs the change in the amount of charge as a change in a voltage; multiplication processor 52 that multiplies sinusoidal voltage v by output voltage V from charge amplifier 44; integrator 54 that smooths, by integration, a result of multiplication by multiplication processor 52; and grip determiner 56 that determines whether the steering wheel is gripped, according to a level of the result smoothed.

According to this configuration, deterioration in accuracy due to frequency variation and influence of noise, for instance, can be reduced so that the detection accuracy can be improved.

Specifically, first, the output voltage from the charge amplifier and the sinusoidal voltage as a driving signal are in phase, that is, have no phase difference, and the multiplication processor detects the capacitance according to whether the steering wheel is gripped by product detection. Accordingly, the switching operation as required in conventional technology is unnecessary, and thus phase shift and signal distortion due to switching can be reduced, deterioration in the detection accuracy can be reduced, and detection accuracy can be improved.

Second, since sensitivity of the output voltage from the charge amplifier does not depend on the frequency of a sinusoidal voltage as a driving signal, and thus even if frequency variation occurs in a sinusoidal signal, deterioration in the detection accuracy can be reduced.

Third, the magnitude of the output voltage from the charge amplifier does not depend on the frequency of the sinusoidal voltage as a driving signal, and thus deterioration in detection accuracy due to exogenous radio-frequency noise can be reduced.

Note that in steering-wheel grip sensor 100 illustrated in FIG. 4, control processor 50 may switch the rectangular-wave signal to one of at least three frequencies, and ADC 62 and ADC 63 may store, for each of the at least three frequencies, the first digital data and the second digital data into memory 57, respectively.

This avoids using first and second digital data corresponding to the frequency, which is influenced by disturbance noise, and allows first and second digital data corresponding to another frequency to be used. Furthermore, frequency hopping can be performed so as to avoid disturbance noise.

ADC 62 and ADC 63 may generate the first digital data and the second digital data, respectively, the first digital data and the second digital data each corresponding to at least two cycles of a waveform of the sinusoidal voltage.

According to this, detection accuracy can be improved as compared with AD conversion performed in units of one cycle.

Note that ADC 62 and ADC 63 may generate the first digital data and the second digital data, respectively, the first digital data and the second digital data each corresponding to at least three cycles of a waveform of the sinusoidal voltage, and multiplication processor 52 may compare portions of the first digital data corresponding to different ones of the at least three cycles of the waveform, and discard one of the portions of the first digital data having a most distant value.

According to this, a portion of digital data corresponding to a cycle other than the cycle for which the value is most distant is used and thus, for example, a portion of digital data which is affected by disturbance noise can be discarded, and detection accuracy can be improved.

ADC 62 and ADC 63 may generate the first digital data and the second digital data, respectively, the first digital data and the second digital data each corresponding to at least three cycles of a waveform of the sinusoidal voltage, and multiplication processor 52 may calculate, for each of the at least three cycles of the waveform, an average and a deviation of a portion of the first digital data corresponding to the cycle, and discard the portion of the first digital data corresponding to the cycle when the deviation is greater than or equal to a threshold.

According to this, a portion of data corresponding to a cycle, which includes disturbance noise, is discarded, and thus noise resistance and accuracy can be increased.

Multiplication processor 52 may change a frequency of the rectangular-wave signal when a predetermined number of cycles for which the deviation is greater than or equal to the threshold are in a continuous series.

According to this, when disturbance noise continuously occurs, the influence of disturbance noise can be reduced by changing the frequencies of a rectangular-wave signal and a sinusoidal voltage.

Embodiment 2

Embodiment 2 describes a configuration of performing correction processing for reducing variation of operation caused by an environmental change that is a change in the environment of steering-wheel grip sensor 100, and failure monitoring for monitoring whether operation is normal, in addition to Embodiment 1.

Specifically, such an environmental change includes, for instance, a change in resistance of outer layer 11 in FIG. 3, a change in capacitance of driven electrode 113 in FIG. 3, and a change in resistance of urethane layer 13 in FIG. 3.

For example, the resistance of outer layer 11 has temperature-moisture/humidity dependent characteristics so as to be dependent on the temperature and moisture/humidity of outer layer 11. With use of such temperature-moisture/humidity dependent characteristics of outer layer 11, steering-wheel grip sensor 100 detects changes in resistance of sensor electrode 112 and outer layer 11, thus substantially detecting the temperature and moisture/humidity without a temperature moisture/humidity sensor. The temperature and moisture/humidity characteristics can be corrected based on the detected change in resistance. Here, the term "temperature and moisture/humidity" means either "both the temperature and moisture/humidity" or "one of the temperature and moisture/humidity". This definition depends on the material of outer layer 11.

Further, driven electrode 113 is opposed to rim 31 with urethane layer 13 being provided therebetween, or is wound around rim 31 with urethane layer 13 being provided therebetween. Thus, driven electrode 113 and rim 31 form a capacitor. Since rim 31 is grounded, the capacitor formed by driven electrode 113 and rim 31 has a certain capacitance. Note that the capacitance has characteristics of varying depending on the temperature and moisture/humidity of urethane layer 13. With use of such temperature and moisture/humidity dependent characteristics, steering-wheel grip sensor 100 detects the temperature and moisture/humidity of driven electrode 113 and urethane layer 13 by detecting change in capacitance of driven electrode 113. Accordingly, the temperature and moisture/humidity characteristics can be corrected even when a temperature moisture/humidity sensor is not provided.

Figure 6:
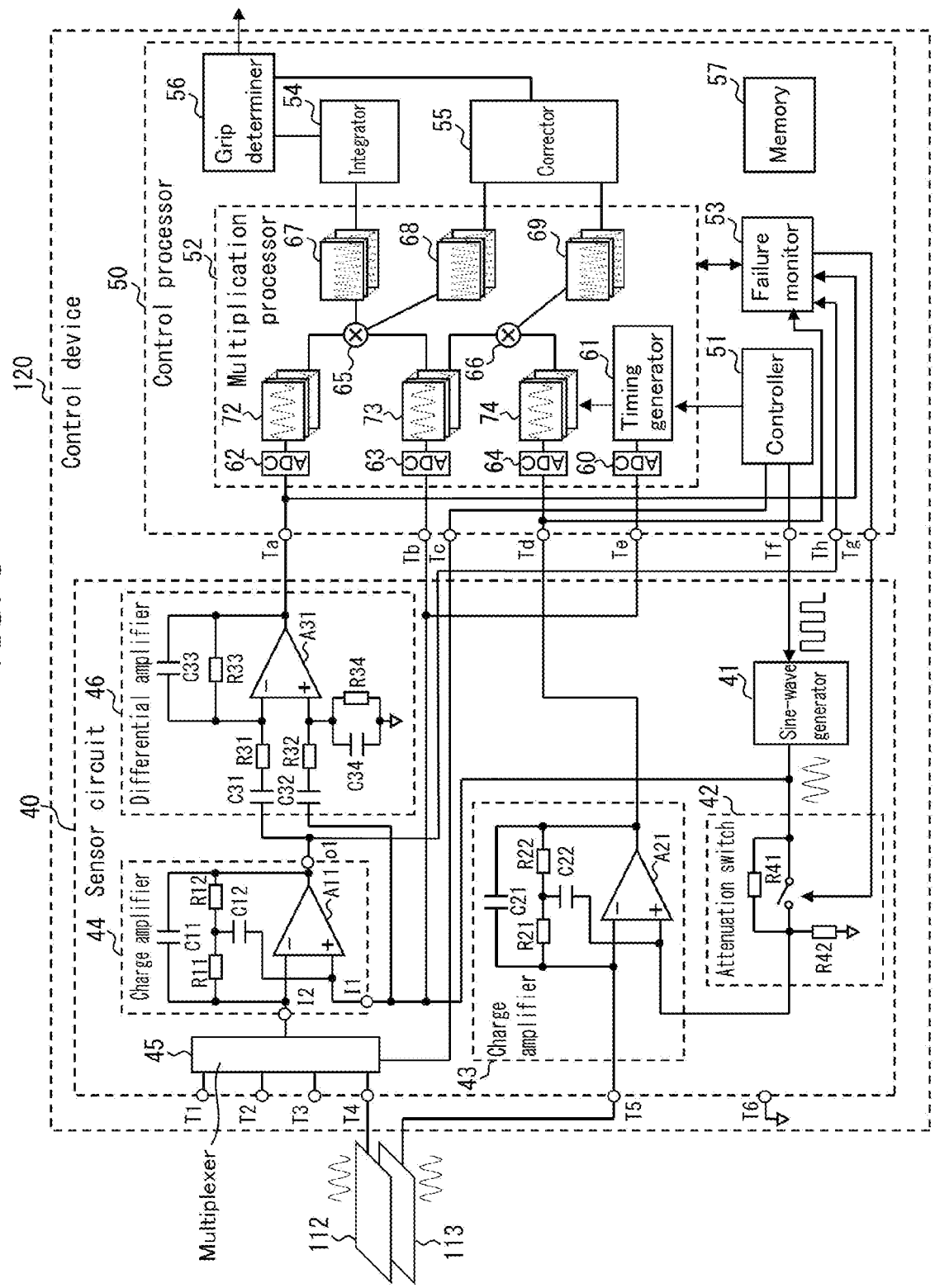
FIG. 6 is a block diagram illustrating an example of a circuit configuration of a steering-wheel grip sensor according to Embodiment 2.

FIG. 6 is a block diagram illustrating an example of a circuit configuration of steering-wheel grip sensor 100 according to Embodiment 2. The configuration illustrated in FIG. 6 is mainly different from the configuration illustrated in FIG. 4 in that sensor terminals T1 to T3, attenuation switch 42, charge amplifier 43, multiplexer 45, selection control terminal Tc, AD terminal Td, AD terminal Te, check (CHK) terminal Tg, output monitor terminal Th, ADC 60, timing generator 61, ADC 64, third digital data 74, multiplier 66, second multiplication data 68, third multiplication data 69, failure monitor 53, and corrector 55 are added and a band-pass filter is added to differential amplifier 46.

The following description focuses on different points while omitting redundant description of the same points.

Sensor terminals T1 to T4 connect four sensor electrodes 112 when four pairs each including sensor electrode 112 and driven electrode 113 are included in steering wheel cover 110.

Attenuation switch 42 switches between (i) attenuating or amplifying a sinusoidal voltage supplied from sine-wave generator 41 to driven electrodes 113 via charge amplifier 43 and (ii) passing the sinusoidal voltage without being attenuated or amplified.

Charge amplifier 43 includes feedback capacitive element C21, detects a change in the amount of charge generated in driven electrode 113 due to an environmental change, and outputs the change in the amount of charge as a change in a voltage. Thus, charge amplifier 43 includes feedback capacitive element C21, operational amplifier A21, resistive elements R21 and R22, and capacitive element C12. Charge amplifier 43 is the same as charge amplifier 44 already described. Note that steering-wheel grip sensor 100 may include current amplifier 47 illustrated in FIG. 5, instead of charge amplifier 43. In this case, current amplifier 47 detects a change in current generated in driven electrode 113 due to an environmental change, and outputs the change in the current as a change in a voltage.

Multiplexer 45 selects one of sensor terminals T1 to T4, and connects the selected sensor terminal to second input terminal I2 of charge amplifier 44. This selection is made according to a selection control signal input from controller 51 via selection control terminal Tc. Note that multiplexer 45 may not connect one of four terminals to one terminal, and may have a configuration of switching connection of one of M terminals to one terminal. M may be an integer of 2, 3, 5, or more, and is an integer greater than the number of pairs each including sensor electrode 112 and driven electrode 113.

Note that the configuration illustrated in FIG. 6 is a configuration in which driven electrodes 113 are included in the pairs and are all electrically connected to one another. Thus, driven electrodes 113 are connected to single drive terminal T5. However, the configuration is not limited to the one as above, and for example, one of driven electrodes 113 may be selected by another multiplexer and connected to drive terminal T5. In this case, driven electrode 113 paired with sensor electrode 112 selected by multiplexer 45 may be selected by the other multiplexer.

Selection control terminal Tc is connected to a control terminal of multiplexer 45 and receives a selection control signal output by controller 51.

AD terminal Td is connected to an output terminal of charge amplifier 43, and is for inputting an analog signal to ADC 64.

AD terminal Te is connected to sine-wave generator 41, and is for inputting a sinusoidal voltage in the form of an analog signal to ADC 60.

CHK terminal Tg is for conveying a check signal from failure monitor 53 to attenuation switch 42. A check signal is a low-level signal in an ordinary monitor mode in which a sinusoidal voltage is not attenuated or amplified by attenuation switch 42, and is a high-level signal in a temporary monitor mode in which a sinusoidal voltage is attenuated or amplified.

Output monitor terminal Th is for conveying an output signal from output terminal o1 to failure monitor 53.

ADC 60 performs AD conversion on a sinusoidal voltage from sine-wave generator 41 and outputs the result of the AD conversion to timing generator 61. Use of the result of AD conversion is different from use of the result of AD conversion by ADC 63. The result of AD conversion by ADC 60 is used to generate a timing signal in synchronization with the waveform of a sinusoidal voltage. Accordingly, ADC 60 performs sampling at a higher rate than ADC 63.

Timing generator 61 generates a timing signal in synchronization with the waveform of a sinusoidal voltage, based on the result of AD conversion by ADC 60. Such a timing signal includes one or more sampling clock signals for ADC 62 and 63. Note that timing generator 61 may generate a timing signal in synchronization with a rectangular-wave signal (that is, a PWM signal) from controller 51. In this case, ADC 60 may not be included.

ADC 64 performs AD conversion on an output voltage from charge amplifier 43 in synchronization with a timing signal from timing generator 61, and stores the result of the AD conversion as third digital data 74 into memory 57.

Third digital data 74 corresponds to the waveform of N cycles of an output voltage from charge amplifier 43. Here, N is the same as the number of cycles of a signal included in first digital data 72.

Multiplier 65 multiplies first digital data 72 by second digital data 73, and stores the result of the multiplication into memory 57 as first multiplication data 67, similarly to FIG. 4. First multiplication data 67 corresponds to capacitance ΔC of sensor electrode 112.

In addition to this, multiplier 65 shifts the phase of the waveform of first digital data 72 by 90 degrees, multiplies phase-shifted first digital data 72 by second digital data 73, and stores the result of the multiplication as second multiplication data 68 into memory 57.

Second multiplication data 68 corresponds to a resistance component dependent on a change in the environment of sensor electrode 112, such as the temperature and moisture/humidity of outer layer 11, for example.

Multiplier 66 multiplies second digital data 73 by third digital data 74, and stores the result of the multiplication into memory 57 as third multiplication data 69.

Third multiplication data 69 corresponds to the capacitance of urethane layer 13 that varies according to a change in the environmental of driven electrode 113 such as the temperature and moisture/humidity of driven electrode 113, for example.

Corrector 55 performs correction processing for reducing variations due to the environmental change, using second multiplication data 68 and third multiplication data 69 as indices of the environmental change. Corrector 55 corrects, for example, thresholds th1 and th2 for the determination by grip determiner 56, as correction processing. Further, corrector 55 may correct the level smoothed by integrator 54, as correction processing. Note that corrector 55 may smooth second multiplication data 68 and third multiplication data 69, and use smoothed second multiplication data 68 and smoothed third multiplication data 69 as indices.

When the resistance of outer layer 11 that is an insulator covering sensor electrode 112 has characteristics of varying according to the temperature and moisture/humidity, for example, the correction processing can improve detection accuracy by reducing such variation. This example specifically includes a change in insulation resistance caused by outer layer 11 being wet with sweat from the hand(s) gripping the steering wheel, according to the temperature. Further, when the capacitance of urethane layer 13 that is an insulator in contact with driven electrode 113 has characteristics of varying according to the moisture/humidity or temperature, for example, correction processing for reducing such variation can improve the detection accuracy. This example specifically includes a change in permittivity of urethane layer 13 caused by urethane layer 13 absorbing moisture, based on the temperature and humidity around and moisture of the steering wheel.

Failure monitor 53 has the ordinary monitor mode in which attenuation switch 42 does not attenuate or amplify a sinusoidal voltage, and the temporary monitor mode in which attenuation switch 42 attenuates and amplifies a sinusoidal voltage, and determines whether failure has occurred. In the ordinary monitor mode, failure monitor 53 determines whether at least one of a ground fault of driven electrode 113 or a ground fault of sensor electrode 112 has occurred. In the temporary monitor mode, failure monitor 53 determines whether at least one of a breakage of driven electrode 113, a breakage of sensor electrode 112, or a short circuit between driven electrode 113 and sensor electrode 112 has occurred. Note that the breakage of driven electrode 113 includes two types of breakages, that is, a breakage of a cable connected to driven electrode 113 and an electrode breakage due to breaking of planar driven electrode 113. A breakage of sensor electrode 112 includes two types of breakages, that is, a breakage of a cable connected to sensor electrode 112 and an electrode breakage due to breaking of planar sensor electrode 112. In the description below, if just "breakage" is stated, it indicates both of the two types of breakages.

Next, failure determination by failure monitor 53 is to be described.

Figure 8:
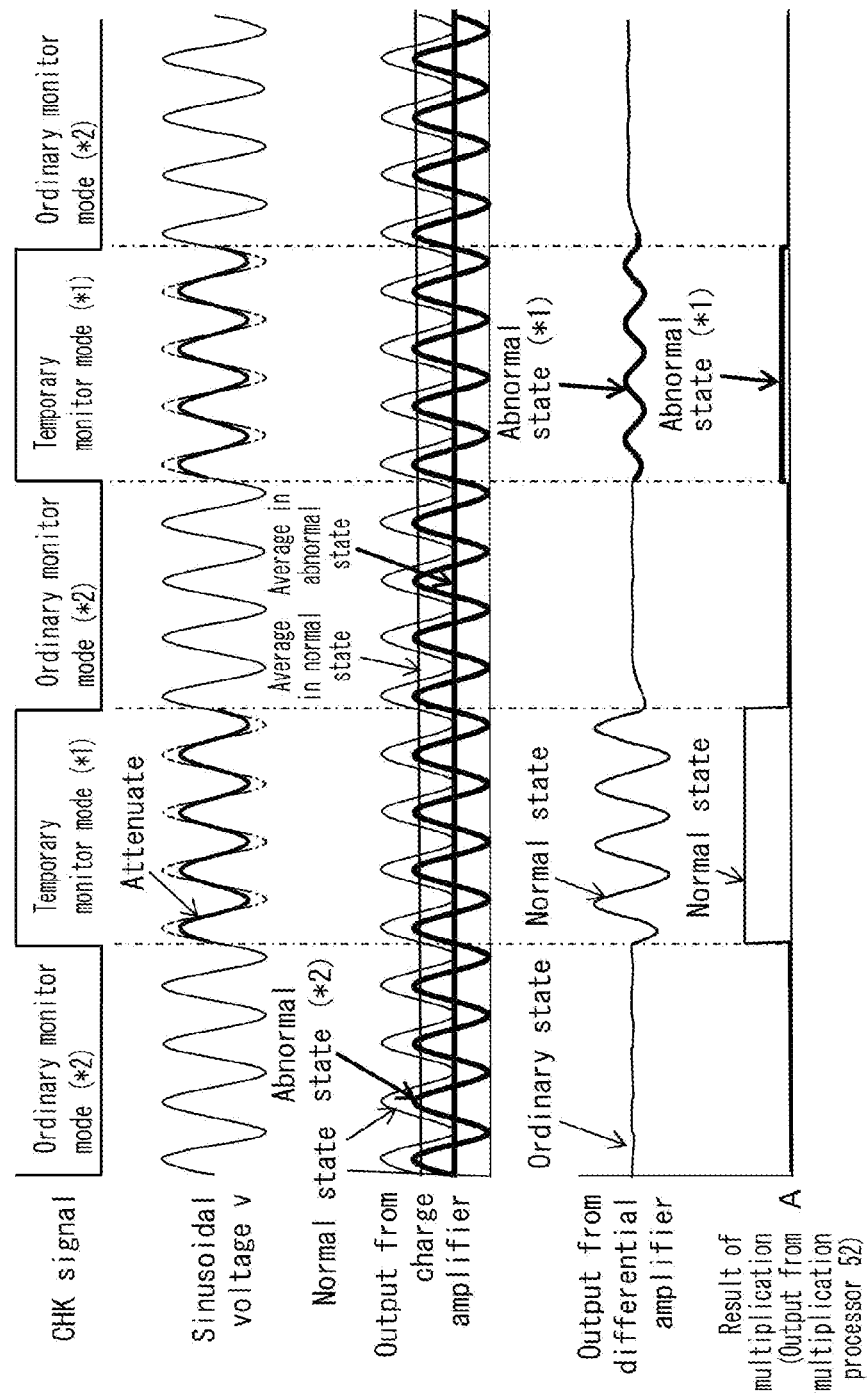
FIG. 8 illustrates various waveforms at the time of failure determination in Embodiment 2.

FIG. 7 is an explanatory diagram of failure determination in Embodiment 2. FIG. 8 illustrates various waveforms at the time of failure determination in Embodiment 2.

The row in FIG. 7 shows the types of failures that are detected in failure determination. The column shows signal change when a failure occurs, and whether failure determination is possible in each of the ordinary monitor mode and the temporary monitor mode that are included in a failure monitor mode. Note that the ordinary monitor mode is normally for monitoring whether a failure has occurred while steering-wheel grip sensor 100 is operating to detect a grip. The temporary monitor mode is for temporarily stopping operating to detect a grip and shifting to a state to monitor whether a failure has occurred.

Failure monitor 53 determines whether driven electrode 113 has a breakage, a ground fault, that is, a short circuit to the ground, or a short circuit to sensor electrode 112. Note that failure monitor 53 cannot determine which type of a failure has occurred, that is, which of a breakage, a ground fault, that is, a short circuit to the ground, or a short circuit to sensor electrode 112 has occurred.

Failure monitor 53 determines whether sensor electrode 112 has a breakage, a ground fault, that is, a short circuit to the ground, or a short circuit to driven electrode 113. Note that failure monitor 53 cannot determine which type of a failure has occurred, that is, which of a breakage, a ground fault, that is, a short circuit to the ground, or a short circuit to driven electrode 113 has occurred.

FIG. 8 illustrates a CHK signal, sinusoidal voltage v, output from charge amplifier 43/44, output from differential amplifier 46, and output from multiplication processor 52 (result of multiplication). Note that FIG. 8 illustrates an example in which the mode switches to the temporary monitor mode when the CHK signal has a high level, and sinusoidal voltage v attenuates.

The following describes specific examples of failure determinations made by failure monitor 53, with reference to FIGS. 7 and 8.

First, as illustrated in FIG. 7, cable breakages of sensor electrode 112 and driven electrode 113 cannot be detected in the ordinary monitor mode, and thus as illustrated in FIG. 8, failure monitor 53 switches the mode to the temporary monitor mode at predetermined timings (for example, once in every 0.3 seconds) during grip detection as indicated by the CHK signal. Failure monitor 53 determines that a cable has a breakage if the output from differential amplifier 46 in the temporary monitor mode has a smaller amplitude change than the output in the temporary monitor mode in a normal state.

Note that failure monitor 53 may determine that a cable has a breakage if, after capturing the output (result of multiplication) from multiplication processor 52 in the temporary monitor mode instead of the output from differential amplifier 46, the result of multiplication more approximates to A than the output in the temporary monitor mode in a normal state. Here, A is defined as a result of multiplication when no grip is made in an ordinary state.

First, as illustrated in FIG. 7, electrode breakages of sensor electrode 112 and driven electrode 113 cannot be detected in the ordinary monitor mode, and thus as illustrated in FIG. 8, failure monitor 53 switches the mode to the temporary monitor mode at predetermined timings (for example, once in every 0.3 seconds) during grip detection as indicated by the CHK signal. Failure monitor 53 determines that an electrode has a breakage if the output from differential amplifier 46 in the temporary monitor mode has a smaller amplitude than the output in the temporary monitor mode in a normal state. Here, a smaller amplitude means that the amplitude decreases as compared with the amplitude of the output from differential amplifier 46 in the temporary monitor mode in a normal state. The amount of decrease in amplitude varies depending on the position of a breakage due to sensor electrode 112/driven electrode 113 breaking, and the closer the electrode breaking portion to a cable, the smaller the amplitude is.

Note that failure monitor 53 may determine that an electrode has a breakage if, after capturing the output (result of multiplication) from multiplication processor 52 instead of differential amplifier 46 in the temporary monitor mode, the result of multiplication indicates a smaller value than the output (result of multiplication) in the temporary monitor mode in a normal state. Here, the amount of decrease in the result of multiplication varies depending on the position of a breakage due to sensor electrode 112/driven electrode 113 breaking, and the closer the electrode breaking portion is to a cable, the smaller the result of multiplication is.

Next, as illustrated in FIG. 7, when it is determined whether sensor electrode 112 and driven electrode 113 are short-circuited to the ground, it can be detected in the ordinary monitor mode, and thus as illustrated in FIG. 8, failure monitor 53 determines, at the time of normal grip detection, whether the output from charge amplifier 43/44 is lower than the output in a normal state. At this time, in order to improve determination accuracy, failure monitor 53 may average the outputs from charge amplifiers 43 and 44, and determine that sensor electrode 112 and driven electrode 113 are short-circuited to the ground when the average value is offset to a smaller value than the one in a normal state.

Note that a short circuit to the ground can be detected in the temporary monitor mode, and thus failure monitor 53 may determine whether a short circuit to the ground has occurred even in the temporary monitor mode.

Next, as illustrated in FIG. 7, when it is determined whether sensor electrode 112 and driven electrode 113 are short-circuited, it can be detected in the ordinary monitor mode similarly to when whether a short circuit to the ground has occurred is determined, and thus as illustrated in FIG. 8, failure monitor 53 determines, at the time of normal grip detection, whether the output from charge amplifier 43 or 44 is lower than the output in a normal state. At this time, in order to improve determination accuracy, failure monitor 53 may average the output from charge amplifier 43 or 44, and determine whether sensor electrode 112 and driven electrode 113 are short-circuited when the average value is offset to a smaller value than the one in a normal state.

Note that a short circuit of sensor electrode 112 and driven electrode 113 can be detected in the temporary monitor mode, and thus failure monitor 53 may determine the occurrence of a short circuit of sensor electrode 112 and driven electrode 113 also in the temporary monitor mode.

Here, the symbols (*1) in FIGS. 7 and 8 mean that determination is made in the temporary monitor mode, based on the output (sense signal) from differential amplifier 46. The symbols (*2) mean that determination is made in both the ordinary monitor mode and the temporary monitor mode, based on the output (a sense signal) from charge amplifier 44 or the output (a driven signal) from charge amplifier 43 or the average of the outputs being offset when a failure occurs (in an abnormal state). The meaning of making the determination indicated by (*1) is as follows. In the ordinary monitor mode, the level of output (a sense signal) from differential amplifier 46 when a failure is occurring hardly changes, and thus failure determination is difficult. In contrast, in the temporary monitor mode, failure monitor 53 can readily make failure determination by attenuating or amplifying a sinusoidal voltage since the amplitude that the voltage is to have (a level change) is smaller when a failure is occurring (in the abnormal state). Note that the output (result of multiplication) from multiplication processor 52 is also smaller in the temporary monitor mode when a failure is occurring (in an abnormal state) than that in a normal state, and thus failure monitor 53 may make failure determination based on the above.

As described above, steering-wheel grip sensor 100 according to Embodiment 2 further includes: failure monitor 53 that monitors whether a failure has occurred; and attenuation switch 42 that attenuates or amplifies the sinusoidal voltage. Failure monitor 53 has an ordinary monitor mode in which attenuation switch 42 does not attenuate or amplify the sinusoidal voltage and a temporary monitor mode in which attenuation switch 42 attenuates or amplifies the sinusoidal voltage. In the ordinary monitor mode, failure monitor 53 monitors whether at least one of a ground fault of driven electrode 113 or a ground fault of sensor electrode 112 has occurred, and in the temporary monitor mode, failure monitor 53 monitors whether at least one of a breakage of driven electrode 113, a breakage of sensor electrode 112, or a short circuit between driven electrode 113 and sensor electrode 112 has occurred.

Here, failure monitor 53 may control an attenuation factor and an amplification factor of attenuation switch 42.

According to this, performance of the steering-wheel grip sensor can be assessed by controlling an attenuation factor and an amplification factor. Furthermore, an attenuation factor and an amplification factor can be appropriately determined according to variations of individual steering-wheel grip sensors.

Here, steering-wheel grip sensor 100 may further include: corrector 55 that performs correction processing for reducing a variation in an amount of charge generated in sensor electrode 112, the variation being caused by an environmental change. Multiplication processor 52 may further: shift a phase of the output voltage from charge amplifier 44 by 90 degrees; multiply the sinusoidal voltage by the output voltage shifted; and output, as an index of the environmental change, a result of multiplying the sinusoidal voltage by the output voltage shifted to corrector 55.

According to this, for example, if the resistance of outer layer 11 which is an insulator that covers sensor electrode 112 has characteristics of varying according to the temperature and moisture/humidity, detection accuracy can be improved by correction processing for reducing such variation.

Here, steering-wheel grip sensor 100 may further include: other charge amplifier 43 that includes feedback capacitive element C21, detects a change in an amount of charge generated in driven electrode 113, and outputs the change in the amount of charge as a change in a voltage, the change in the amount of charge being caused by an environmental change; and corrector 55 that performs correction processing for reducing a variation in the amount of charge generated in driven electrode 113, the variation being caused by the environmental change. Multiplication processor 52 may further: multiply the sinusoidal voltage by an output voltage from other charge amplifier 43; and output, as an index of the environmental change, a result of multiplying the sinusoidal voltage by the output voltage to corrector 55.

According to this, for example, if the capacitance of urethane layer 13 which is an insulator in contact with driven electrode 113 has characteristics of varying according to the moisture/humidity or temperature, detection accuracy can be improved by correction processing for reducing such variation.

Here, steering-wheel grip sensor 100 may further include: current amplifier 47 that includes feedback resistive element R, and outputs a change in a current generated in driven electrode 113 as a change in a voltage; and corrector 55 that performs correction processing for reducing a variation in the current generated in driven electrode 113, the variation being caused by an environmental change. Multiplication processor 52 may further multiply the sinusoidal voltage by an output voltage from current amplifier 47, and output, as an index of the environmental change, a result of multiplying the sinusoidal voltage by the output voltage to corrector 55.

According to this, for example, if the resistance of an insulator in contact with driven electrode 113 has characteristics of varying according to the moisture/humidity or temperature, detection accuracy can be improved by correction processing for reducing such variation.

Embodiment 3

Embodiment 3 describes a configuration of conducting failure monitor to monitor whether operation of charge amplifier 44 is normal and whether operation of differential amplifier 46 is normal.

Figure 10:
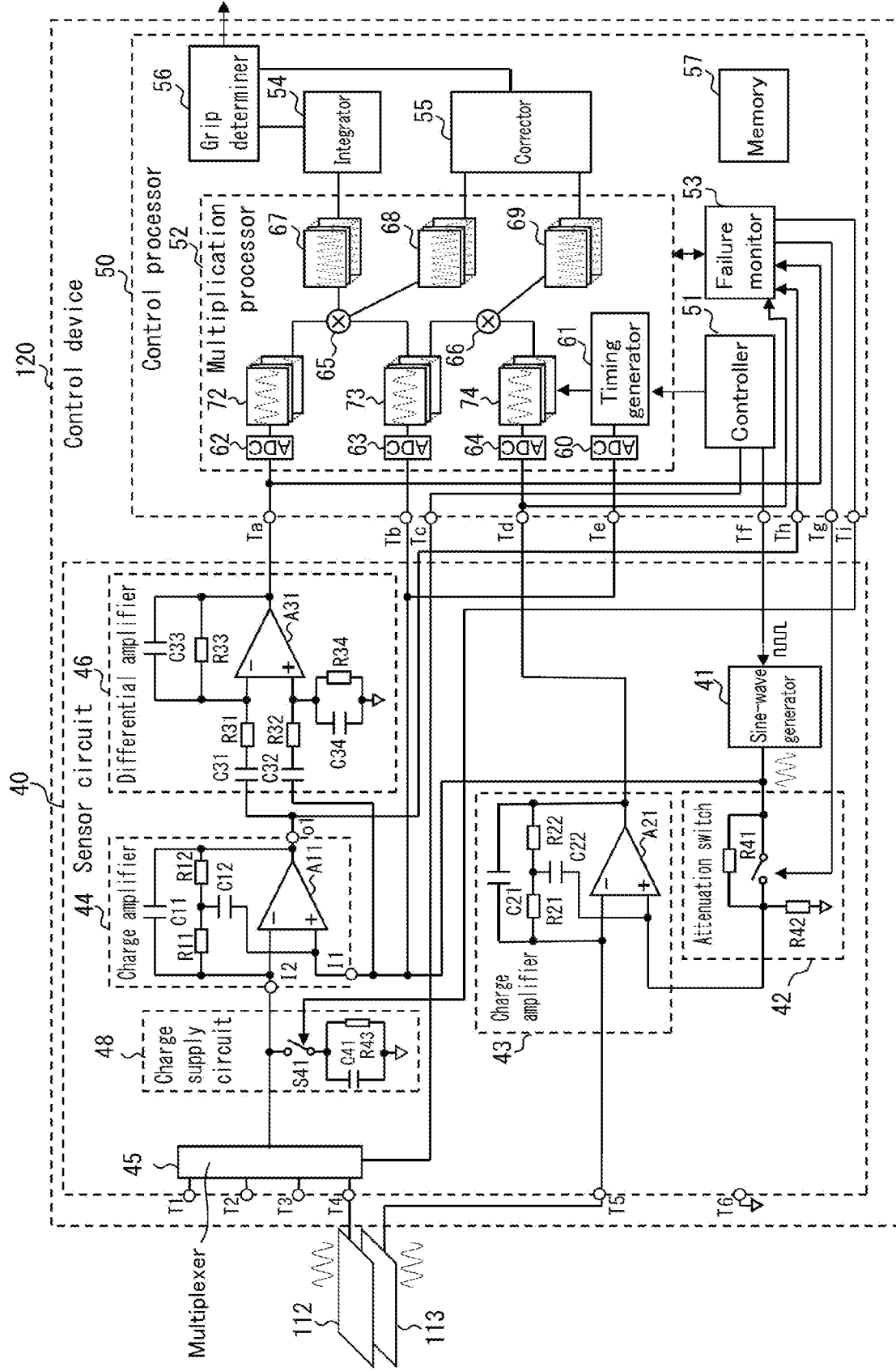
FIG. 10 is a block diagram illustrating an example of a circuit configuration of a steering-wheel grip sensor according to Embodiment 3.

FIG. 10 is a block diagram illustrating an example of a circuit configuration of steering-wheel grip sensor 100 according to Embodiment 3. FIG. 10 is mainly different from FIG. 6 in that charge supply circuit 48 and CHK terminal Ti are added.

The following description focuses on different points while omitting redundant description of the same points.

Charge supply circuit 48 includes switch S41, and resistor R43 and condenser C41 that are connected in parallel.

An end of a parallel circuit that includes resistor R43 and condenser C41 is connected to an end of switch S41. Another end of the parallel circuit is connected to a ground line.

Switch S41 has an end connected to the end of the parallel circuit that includes resistor R43 and condenser C41. Another end of switch S41 is connected to a line that connects an output terminal of multiplexer 45 and second input terminal I2 of charge amplifier 44. Switch S41 is turned on or off according to a second check signal from failure monitor 53. When switch S41 is turned on, an input value from charge amplifier 44 to second input terminal I2 changes. Note that the resistance of resistor R43 and the capacitance of condenser C41 are predetermined. The circuit configuration allows charge supply circuit 48 to supply charge for testing in an operation mode for failure monitoring. Thus, in the operation mode for failure monitoring, charge supply circuit 48 supplies a predetermined amount of charge to charge amplifier 44 through second input terminal I2 by switch S41 being turned on. The predetermined amount of charge is determined in advance in order to determine whether the operation is normal, and is determined based on the resistance of resistor R43 and the capacitance of condenser C41.

CHK terminal Ti is for conveying a second check signal from failure monitor 53 to charge supply circuit 48. The second check signal has a low level in an ordinary state, and has a high level when whether the operation of charge amplifier 44 is normal is monitored. Note that when the second check signal has the low level, switch S41 is off, and when the second check signal has the high level, switch S41 is on.

Note that when whether the operation of charge amplifier 44 is normal and whether the operation of differential amplifier 46 is normal are monitored, multiplexer 45 may be connected to one of sensor terminals T1 to T4 or may be in an off state in which multiplexer 45 is connected to none of sensor terminals T1 to T4.

Failure monitor 53 monitors whether the operations of charge amplifier 44 and differential amplifier 46 are normal in the operation mode for failure monitoring.

First, monitoring the operation of charge amplifier 44 by failure monitor 53 is to be described.

Note that failure monitor 53 monitors whether the operations of charge amplifier 44 and differential amplifier 46 are normal when a user is not gripping steering wheel 3 (for example, when ignition of vehicle 1 is switched on or immediately after it is detected that the user is not gripping steering wheel 3).

First, failure monitor 53 receives an output signal through output terminal o1 via output monitor terminal Th when the second check signal has the low level, or in other words, in a state in which switch S41 is off, and stores the output signal into memory 57.

Next, failure monitor 53 sets the second check signal to the high level so as to turn on switch S41, and receives an output signal through output terminal o1 in a state in which switch S41 is on.

Failure monitor 53 calculates an amount of change by comparing an output signal transmitted through output terminal o1 in a state in which switch S41 is off and stored in memory 57 with an output signal transmitted through output terminal o1 in a state in which switch S41 is on and stored in memory 57.

Here, as described above, the resistance of resistor R43 and the capacitance of condenser C41 are predetermined, and thus the amount of change in the output signal transmitted through output terminal o1 when switch S41 transitions from off to on can be predicted.

Accordingly, failure monitor 53 compares the calculated amount of change with the amount of change predicted in advance, and determines that the operation of charge amplifier 44 is normal if the calculated amount of change is different from the amount of change predicted in advance by a predetermined amount or less, and determines that the operation of charge amplifier 44 is abnormal if the calculated amount of change is different from the amount of change predicted in advance by the predetermined amount or more.

Next, monitoring the operation of differential amplifier 46 by failure monitor 53 is to be described.

Failure monitor 53 monitors whether the operation of differential amplifier 46 is normal when failure monitor 53 determines that the operation of charge amplifier 44 is normal.

First, failure monitor 53 receives an output signal through an output terminal of differential amplifier 46 via AD terminal Ta when the second check signal has the low level, or in other words, in a state in which switch S41 is off, and stores the output signal into memory 57.

Next, failure monitor 53 sets the second check signal to the high level so as to turn on switch S41, and receives an output signal through the output terminal of differential amplifier 46 in a state in which switch S41 is on.

Failure monitor 53 calculates an amount of change by comparing the output signal from differential amplifier 46 stored in memory 57 in a state in which switch S41 is off with the output signal from differential amplifier 46 stored in memory 57 in a state in which switch S41 is on.

Here, as described above, the resistance of resistor R43 and the capacitance of condenser C41 are predetermined and furthermore, the operation of charge amplifier 44 is normal, and thus the amount of change in an output signal from differential amplifier 46 when switch S41 transitions from off to on can be predicted.

Accordingly, failure monitor 53 compares the calculated amount of change with the amount of change predicted in advance, determines that the operation of differential amplifier 46 is normal when the calculated amount of change is different from the amount of change predicted in advance by a predetermined amount or less, and determines that the operation of differential amplifier 46 is abnormal when the calculated amount of change is different from the amount of change predicted in advance by the predetermined amount or more.

As described above, steering-wheel grip sensor 100 according to Embodiment 3 further includes charge supply circuit 48, and can monitor whether the operations of charge amplifier 44 and differential amplifier 46 are normal.

Note that the present application is not limited to Embodiment 3 described above, and switch S41 may be turned on first and an output signal through output terminal o1 or from differential amplifier 46 may be stored into memory 57, and thereafter switch S41 may be turned off, and an output signal through output terminal o1 or from differential amplifier 46 may be received and compared with data of an output signal stored in memory 57.

Embodiment 4

Embodiment 4 describes a configuration of performing correction processing for reducing variations of operation caused by a change in the environment of steering-wheel grip sensor 100, in addition to Embodiment 2 or 3.

Such environmental change in Embodiment 4 specifically includes a change in resistance of dielectric layer 12, change in capacitance of sensor electrode 112, and a change in the resistance of urethane layer 13, for instance, which are caused by both of or one of changes in temperature and moisture/humidity. In the following, the term "temperature and moisture/humidity" means both of the temperature and moisture/humidity or either the temperature or moisture/humidity.

Sensor electrode 112 is wound around rim 31 with dielectric layer 12 being provided therebetween. Rim 31 is grounded, or in other words, sensor electrode 112 is connected to the ground with resistor Rx being provided therebetween. Resistor Rx has parasitic resistance based on a resistance component of dielectric layer 12 located between sensor electrode 112 and the ground. Resistor Rx has temperature and moisture/humidity dependent characteristics.

Sensor electrode 112 is opposed to rim 31 with urethane layer 13, for instance, being provided therebetween, or is wound around rim 31 with urethane layer 13, for instance, being provided therebetween. Thus, sensor electrode 112 and rim 31 form capacitor Cx. Since rim 31 is grounded, capacitor Cx that includes sensor electrode 112 and rim 31 has a certain capacitance. Note that the capacitance has characteristics of varying depending on the temperature and moisture/humidity of dielectric layer 12 and urethane layer 13, for instance.

Here, resistor Rx and capacitor Cx have a correlation. Preferably, dielectric layer 12 and urethane layer 13, for instance, are provided so that the correlation is a correlation (hereinafter, referred to as a design objective relation) that is less likely to affect determination by steering-wheel grip sensor 100 as to whether the starring wheel is gripped, even if the resistance of resistor Rx and the capacitance of capacitor Cx change depending on the temperature and moisture/humidity. However, there are cases where the correlation between resistor Rx and capacitor Cx is far from the design objective relation, due to variations of individual products or deterioration over time, for instance.

In steering-wheel grip sensor 100 according to Embodiment 4, correction processing for preventing the correlation between resistor Rx and capacitor Cx from being apart from the design objective relation, due to variations of individual products or deterioration over time, for instance. Accordingly, a change in the operation of steering-wheel grip sensor 100 due to the environmental change can be reduced as a result.

Figure 11:
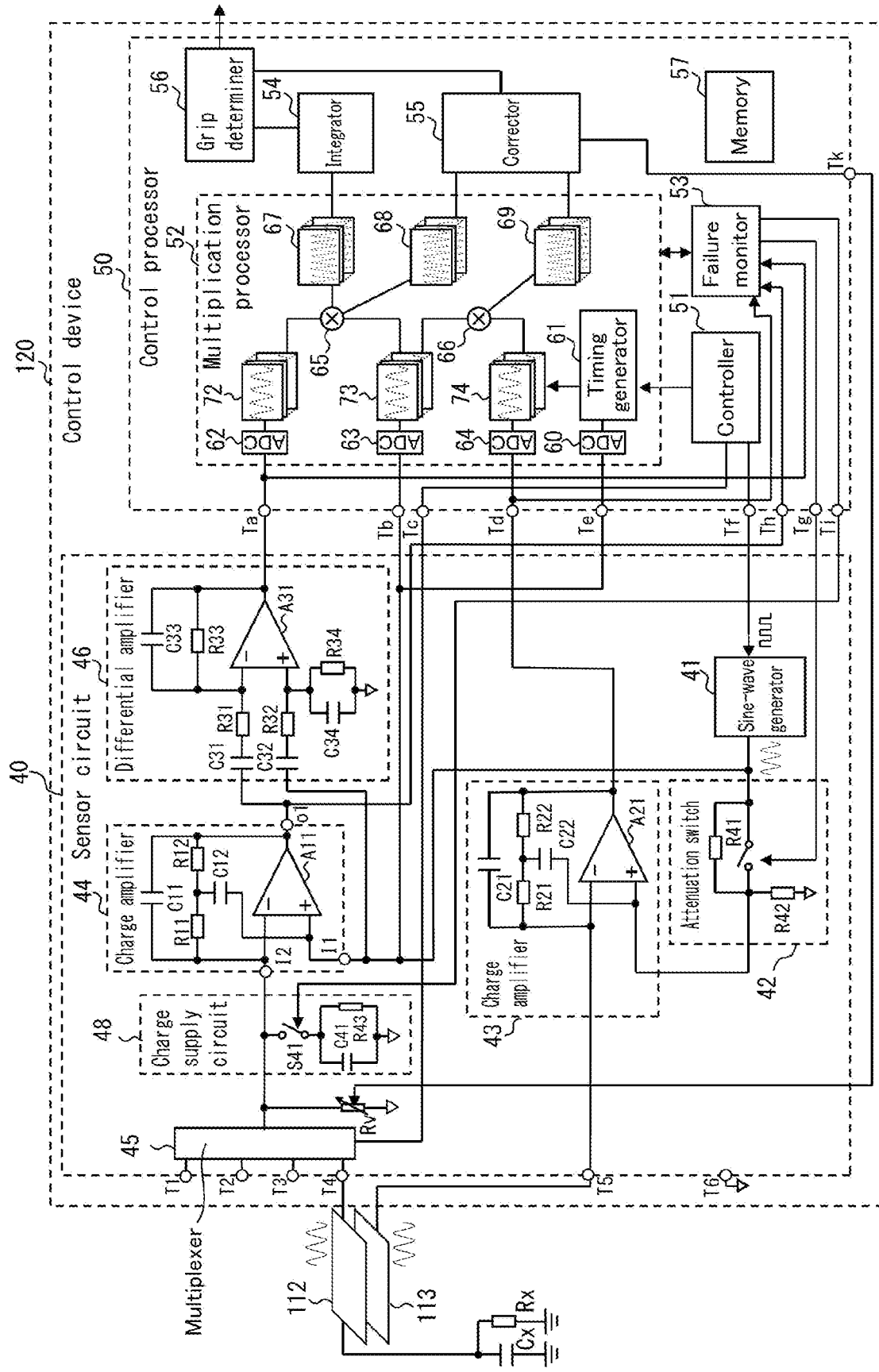
FIG. 11 is a block diagram illustrating an example of a circuit configuration of a steering-wheel grip sensor according to Embodiment 4.

FIG. 11 is a block diagram illustrating an example of a circuit configuration of steering-wheel grip sensor 100 according to Embodiment 4. FIG. 11 is mainly different from FIG. 10 in that variable resistor Rv and correction control terminal Tk are added.

The following description focuses on different points while omitting redundant description of the same points.

Variable resistor Rv is connected between a ground (signal ground) line and a line that connects the output terminal of multiplexer 45 and second input terminal I2 of charge amplifier 44. Variable resistor Rv has a resistance that changes according to a correction control signal output from corrector 55 through correction control terminal Tk.

Correction control terminal Tk is for conveying a correction control signal from corrector 55 to variable resistor Rv.

Corrector 55 determines, from second multiplication data 68 and third multiplication data 69, whether the correlation between resistor Rx and capacitor Cx is apart from the design objective relation by a predetermined value or more.

Specifically, corrector 55 makes the determination as follows. Second multiplication data 68 and third multiplication data 69 have a relation to resistor Rx and capacitor Cx. Accordingly, for example, second multiplication data 68 and third multiplication data 69 corresponding to the design objective relation when the user is not gripping steering wheel 3 are stored for each degree of temperature and each degree of moisture/humidity. If (i) current second multiplication data 68 and current third multiplication data 69 when the user is not gripping steering wheel 3 and (ii) second multiplication data 68 and third multiplication data 69 when the user is not gripping steering wheel 3 under the same conditions as the current temperature and moisture/humidity are apart from each other by a predetermined value or more, a correlation between resistor Rx and capacitor Cx is determined to be apart from the design objective relation by the predetermined value or more.

If the correlation between resistor Rx and capacitor Cx is apart from the design objective relation by the predetermined value or more, corrector 55 performs correction by changing the resistance of variable resistor Rv to make the correlation between resistor Rx and capacitor Cx closer the design objective relation.

Specifically, for example, if the resistance of resistor Rx is small with respect to the capacitance of capacitor Cx and the correlation is apart from the design objective relation, corrector 55 conveys a correction control signal to variable resistor Rv and increases the resistance of variable resistor Rv.

Here, combined resistor Rs of resistor Rx and variable resistor Rv is represented by Expression 1.

[Math 1]

$$Rs = \frac{Rx \cdot Rv}{Rx + Rv} = \frac{Rx}{1 + Rx/Rv} \quad \text{(Expression 1)}$$

The correlation can be prevented from being apart from the design objective relation by increasing the resistance of variable resistor Rv to make the resistance of combined resistor Rs closer to the resistance of the design objective relation with respect to the capacitance of capacitor Cx.

Similarly, for example, if the resistance of resistor Rx is great with respect to the capacitance of capacitor Cx and the correlation is apart from the design objective relation, corrector 55 conveys a correction control signal to variable resistor Rv to decrease the resistance of variable resistor Rv, so as to make the resistance of combined resistor Rs close to the resistance of the design objective relation.

Figure 12:
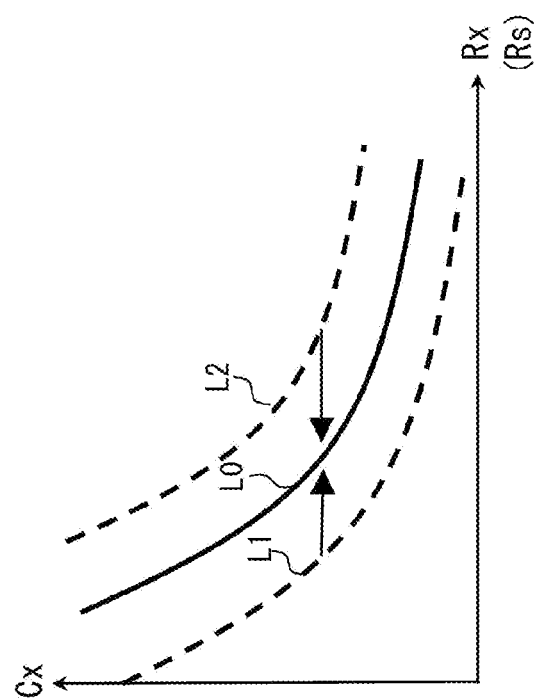
FIG. 12 illustrates an example of a correlation between resistor Rx and capacitor Cx of the steering-wheel grip sensor according to Embodiment 4.

FIG. 12 illustrates an example of a correlation between resistor Rx and capacitor Cx. The vertical axis indicates the capacitance of capacitor Cx, and the horizontal axis indicates the resistance of resistor Rx or combined resistor Rs. Solid line L0 indicates the design objective relation and, for example, indicates a correlation in an initial state at the time of factory shipment or a correlation at an ordinary temperature. Broken lines L1 and L2 indicate cases where the correlation between resistor Rx and capacitor Cx is far from the design objective relation, due to variations of individual products or deterioration over time, for instance. Corrector 55 corrects the resistance of combined resistor Rs by increasing/decreasing the resistance of variable resistor Rv. As shown by the arrows in FIG. 12, broken lines L1 and L2 apart from the design objective relation can be brought closer to the design objective relation indicated by solid line L0.

Such a configuration allows correction processing for preventing the correlation between resistor Rx and capacitor Cx from being apart from the design objective relation due to variations of individual products or deterioration over time, and as a result, variation in the operation of steering-wheel grip sensor 100 caused by an environmental change can be reduced.

Note that in the above embodiments, each of the elements may be configured by dedicated hardware, or may be obtained by executing a software program suitable for the element. Each element may be obtained by a program executor such as a CPU or a processor reading and executing a software program stored in a recording medium such as a hard disk or semiconductor memory. Here, the software that allows actualization of the steering-wheel grip sensor according to the embodiments is a program as follows.

Thus, this program causes a computer to execute a grip detection method for use in a steering-wheel grip sensor that includes a driven electrode having a planar shape and extending along a rim of a steering wheel, and a sensor electrode having a planar shape and opposed to the driven electrode. The grip detection method includes: supplying a sinusoidal voltage to the driven electrode; detecting, by a charge amplifier that includes a feedback capacitive element, a change in an amount of charge generated according to capacitance of the sensor electrode; generating, by the charge amplifier, an output voltage that changes according to the change in the amount of charge detected; multiplying the sinusoidal voltage by the output voltage generated by the charge amplifier; smoothing, by integration, a result of multiplying the sinusoidal voltage by the output voltage; and determining whether the steering wheel is gripped, according to a level of the result smoothed.

The above is a description of the steering-wheel grip sensor according to one or more aspects based on the embodiments, but the present disclose is not limited to those embodiments. The scope of the one or more aspects of the present disclosure also encompasses embodiments as a result of adding, to the embodiments, various modifications that may be conceived by those skilled in the art, and embodiments obtained by combining elements in different embodiments as long as the resultant embodiments do not depart from the spirit of the present disclosure.

While various embodiments have been described herein above, it is to be appreciated that various changes in form and detail may be made without departing from the spirit and scope of the present disclosure as presently or hereafter claimed.

Further Information about Technical Background to this Application

The disclosures of the following Japanese Patent Applications including specification, drawings and claims are incorporated herein by reference in their entirety: Japanese Patent Application No. 2020-093496 filed on May 28, 2020 and Japanese Patent Application No. 2021-006976 filed on Jan. 20, 2021.

INDUSTRIAL APPLICABILITY

The present disclosure is applicable to a steering-wheel grip sensor that detects a grip of a person on a steering wheel.

The invention claimed is:
1. A steering-wheel grip sensor, comprising:
a driven electrode having a planar shape and extending along a rim of a steering wheel;
a sensor electrode having a planar shape and opposed to the driven electrode;
a sine-wave generator that supplies a sinusoidal voltage to the driven electrode;
a charge amplifier that includes a feedback capacitive element, detects a change in an amount of charge generated according to capacitance of the sensor electrode, and outputs the change in the amount of charge as a change in a voltage;
a multiplication processor that multiplies the sinusoidal voltage by an output voltage from the charge amplifier;
an integrator that smooths, by integration, a result of multiplication by the multiplication processor; and a grip determiner that determines whether the steering wheel is gripped, according to a level of the result smoothed, wherein the sine-wave generator receives a rectangular-wave signal, and generates the sinusoidal voltage in synchronization with the rectangular-wave signal, and the steering-wheel grip sensor further comprises:
- a memory;
- a first analog-to-digital (AD) converter that performs AD conversion on the output voltage from the charge amplifier in synchronization with the rectangular-wave signal, and stores a result of the AD conversion into the memory as first digital data; and
- a second AD converter that performs AD conversion on the sinusoidal voltage from the sine-wave generator in synchronization with the rectangular-wave signal, and stores a result of the AD conversion into the memory as second digital data.

2. The steering-wheel grip sensor according to claim 1, wherein the charge amplifier includes:
- a first input terminal that receives the sinusoidal voltage;
- a second input terminal connected to the sensor electrode;
- an output terminal;
- the feedback capacitive element connected between the output terminal and the second input terminal; and
- an operational amplifier connected to the first input terminal, the second input terminal, and the output terminal, and the charge amplifier supplies the sinusoidal voltage output through the output terminal to the sensor electrode via the feedback capacitive element.

3. The steering-wheel grip sensor according to claim 1, wherein the charge amplifier includes a low-pass filter connected in parallel to the feedback capacitive element, and the low-pass filter passes a signal having a frequency lower than a frequency of the sinusoidal voltage.

4. The steering-wheel grip sensor according to claim 1, wherein the multiplication processor performs processing for averaging each of a waveform indicated by the first digital data and a waveform indicated by the second digital data, and multiplies an average of the first digital data by an average of the second digital data.

5. The steering-wheel grip sensor according to claim 1, wherein the multiplication processor multiplies the first digital data by the second digital data, and performs processing for averaging a waveform indicated by digital data resulting from multiplying the first digital data by the second digital data.

6. The steering-wheel grip sensor according to claim 4, wherein the rectangular-wave signal is switched to one of at least three frequencies, and the first AD converter and the second AD converter store, for each of the at least three frequencies, the first digital data and the second digital data into the memory, respectively.

7. The steering-wheel grip sensor according to claim 4, wherein the first AD converter and the second AD converter generate the first digital data and the second digital data, respectively, the first digital data and the second digital data each corresponding to at least two cycles of a waveform of the sinusoidal voltage.

8. The steering-wheel grip sensor according to claim 4, wherein the first AD converter and the second AD converter generate the first digital data and the second digital data, respectively, the first digital data and the second digital data each corresponding to at least three cycles of a waveform of the sinusoidal voltage, and the multiplication processor compares portions of the first digital data corresponding to different ones of the at least three cycles of the waveform, and discards one of the portions of the first digital data having a most distant value.

9. The steering-wheel grip sensor according to claim 4, wherein the first AD converter and the second AD converter generate the first digital data and the second digital data, respectively, the first digital data and the second digital data each corresponding to at least three cycles of a waveform of the sinusoidal voltage, and the multiplication processor calculates, for each cycle of the at least three cycles of the waveform, an average and a deviation of a portion of the first digital data corresponding to the cycle, and discards the portion of the first digital data corresponding to the cycle when the deviation is greater than or equal to a threshold.

10. The steering-wheel grip sensor according to claim 9, wherein the multiplication processor changes a frequency of the rectangular-wave signal when a predetermined number of cycles for which the deviation is greater than or equal to the threshold are in a continuous series.

11. The steering-wheel grip sensor according to claim 1, further comprising:
- a monitor that monitors whether a failure has occurred; and
- an attenuation switch that attenuates or amplifies the sinusoidal voltage, wherein the monitor has an ordinary monitor mode in which the attenuation switch does not attenuate or amplify the sinusoidal voltage and a temporary monitor mode in which the attenuation switch attenuates or amplifies the sinusoidal voltage, in the ordinary monitor mode, the monitor monitors whether at least one of a ground fault of the driven electrode or a ground fault of the sensor electrode has occurred, and in the temporary monitor mode, the monitor monitors whether at least one of a breakage of the driven electrode, a breakage of the sensor electrode, or a short circuit between the driven electrode and the sensor electrode has occurred.

12. The steering-wheel grip sensor according to claim 11, wherein the monitor controls an attenuation factor and an amplification factor of the attenuation switch.

13. The steering-wheel grip sensor according to claim 1, further comprising:
- a corrector that performs correction processing for reducing a variation in an amount of charge generated in the sensor electrode, the variation being caused by an environmental change, wherein the multiplication processor further:
- shifts a phase of the output voltage from the charge amplifier by 90 degrees;
- multiplies the sinusoidal voltage by the output voltage shifted; and
- outputs, as an index of the environmental change, a result of multiplying the sinusoidal voltage by the output voltage shifted to the corrector.

14. The steering-wheel grip sensor according to claim 1, further comprising:
- an other charge amplifier that includes a second feedback capacitive element, detects a change in an amount of charge generated in the driven electrode, and outputs the change in the amount of charge generated in the driven electrode as a second change in a second voltage, the change in the amount of charge generated in the driven electrode being caused by an environmental change; and a corrector that performs correction processing for reducing a variation in the amount of charge generated in the driven electrode, the variation being caused by the environmental change, wherein the multiplication processor further:
multiplies the sinusoidal voltage by an output voltage from the other charge amplifier; and
outputs, as an index of the environmental change, a result of multiplying the sinusoidal voltage by the output voltage from the other charge amplifier to the corrector.

15. The steering-wheel grip sensor according to claim 1, further comprising:
a current amplifier that includes a feedback resistive element, and outputs a change in a current generated in the driven electrode as a second change in a second voltage; and
a corrector that performs correction processing for reducing a variation in the current generated in the driven electrode, the variation being caused by an environmental change,
wherein the multiplication processor further multiplies the sinusoidal voltage by an output voltage from the current amplifier, and outputs, as an index of the environmental change, a result of multiplying the sinusoidal voltage by the output voltage from the current amplifier to the corrector.

16. The steering-wheel grip sensor according to claim 3, wherein the low-pass filter includes:
a first resistive element;
a second resistive element connected in series to the first resistive element;
a first capacitive element connected to a connecting point of the first resistive element and the second resistive element; and
a third resistive element connected in series to the first capacitive element.

17. The steering-wheel grip sensor according to claim 11, further comprising:
a charge supply circuit that supplies a predetermined amount of charge to the charge amplifier in an operation mode for failure monitoring,
wherein the monitor monitors whether operation of the charge amplifier is normal, based on an output from the charge amplifier when the predetermined amount of charge is not supplied from the charge supply circuit, and an output from the charge amplifier when the predetermined amount of charge is supplied from the charge supply circuit.

18. The steering-wheel grip sensor according to claim 1, further comprising:
a variable resistor provided between a ground and a connecting point of the sensor electrode and the charge amplifier.

19. A grip detection method for use in a steering-wheel grip sensor that includes a driven electrode having a planar shape and extending along a rim of a steering wheel, and a sensor electrode having a planar shape and opposed to the driven electrode, the grip detection method comprising:
receiving a rectangular-wave signal, and generating a sinusoidal voltage in synchronization with the rectangular-wave signal;
supplying the sinusoidal voltage to the driven electrode;
detecting, by a charge amplifier that includes a feedback capacitive element, a change in an amount of charge generated according to capacitance of the sensor electrode;
generating, by the charge amplifier, an output voltage that changes according to the change in the amount of charge detected;
performing a first AD conversion on the output voltage generated by the charge amplifier in synchronization with the rectangular-wave signal, and storing a result of the first AD conversion into a memory as first digital data;
performing a second AD conversion on the sinusoidal voltage in synchronization with the rectangular-wave signal, and storing a result of the second AD conversion into the memory as second digital data;
multiplying the sinusoidal voltage by the output voltage generated by the charge amplifier;
smoothing, by integration, a result of the multiplying of the sinusoidal voltage by the output voltage generated by the charge amplifier; and
determining whether the steering wheel is gripped, according to a level of the result of the smoothing.

20. A steering-wheel grip sensor, comprising:
a driven electrode having a planar shape and extending along a rim of a steering wheel;
a sensor electrode having a planar shape and opposed to the driven electrode;
a sine-wave generator that supplies a sinusoidal voltage to the driven electrode;
a charge amplifier that includes a feedback capacitive element, detects a change in an amount of charge generated according to capacitance of the sensor electrode, and outputs the change in the amount of charge as a change in a voltage;
a multiplication processor that multiplies the sinusoidal voltage by an output voltage from the charge amplifier;
an integrator that smooths, by integration, a result of multiplication by the multiplication processor; and
a grip determiner that determines whether the steering wheel is gripped, according to a level of the result smoothed,
wherein the charge amplifier includes a low-pass filter connected in parallel to the feedback capacitive element, and
the low-pass filter passes a signal having a frequency lower than a frequency of the sinusoidal voltage.

* * * * *